(12) United States Patent     (10) Patent No.:   US 12,592,284 B2

Wu et al.     (45) Date of Patent:    Mar. 31, 2026

(54) THREE-DIMENSIONAL MEMORY AND OPERATING METHOD THEREOF

(71) Applicant: MACRONIX International Co., Ltd., Hsinchu (TW)

(72) Inventors: Ming-Hung Wu, Nantou County (TW); Wei-Chen Chen, Taoyuan City (TW); Hang-Ting Lue, Hsinchu County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 112 days.

(21) Appl. No.: 18/801,761

(22) Filed: Aug. 13, 2024

(65) Prior Publication Data

US 2026/0051352 A1     Feb. 19, 2026

(51) Int. Cl.

| | |
|---|---|
| *H01L 27/11556* | (2017.01) |
| *G11C 16/04* | (2006.01) |
| *G11C 16/14* | (2006.01) |
| *H01L 27/11519* | (2017.01) |
| *H01L 27/11565* | (2017.01) |
| *H01L 27/11582* | (2017.01) |
| *H10B 41/10* | (2023.01) |
| *H10B 41/27* | (2023.01) |
| *H10B 99/00* | (2023.01) |

(52) U.S. Cl.
CPC ............. *G11C 16/14* (2013.01); *H10B 41/10* (2023.02); *H10B 41/27* (2023.02); *H10B 99/20* (2023.02)

(58) Field of Classification Search
CPC ............ G11C 16/0416; G11C 16/0483; H10B 41/10; H10B 41/27; H10B 43/10; H10B 43/20; H10B 43/27
See application file for complete search history.

(56) References Cited

U.S. PATENT DOCUMENTS

| | | | | |
|---|---|---|---|---|
| 9,595,535 B1* | 3/2017 | Ogawa | ................... | H10B 43/50 |
| 2019/0081065 A1* | 3/2019 | Lee | ........................ | H10B 43/30 |

(Continued)

FOREIGN PATENT DOCUMENTS

| | | |
|---|---|---|
| TW | 202118055 | 5/2021 |
| TW | 202245217 | 11/2022 |
| TW | 202332002 | 8/2023 |

OTHER PUBLICATIONS

"Office Action of Taiwan Counterpart Application", issued on Jun. 5, 2025, p. 1-p. 3.

*Primary Examiner* — Yong J Choe

(74) *Attorney, Agent, or Firm* — J.C. PATENTS

(57) ABSTRACT

Provided are a 3D memory and an operating method thereof. In the 3D memory, a stacked structure includes gate layers and insulating layers alternately stacked. Each gate layer includes first and second gates spaced from each other. Each annular channel layer corresponds to one of the gate layers and is disposed between adjacent insulating layers. A p-type doping region is disposed in each channel layer and adjacent to the first gate. An n-type doped region is disposed in each channel layer and adjacent to the second gate. A source line pillar penetrates through the stacked structure and contacts the n-type doped region. A bit line pillar penetrates through the stack structure and contacts the p-type doped region. A first gate insulation layer is disposed between the first gate and the channel layer. A second gate insulation layer is disposed between the second gate and the channel layer.

20 Claims, 33 Drawing Sheets

10

(56) References Cited

U.S. PATENT DOCUMENTS

| 2020/0013791 | A1  | 1/2020  | Or-Bach et al. |
| 2023/0337422 | A1* | 10/2023 | Hu ..................... G11C 16/0483 |
| 2024/0147740 | A1  | 5/2024  | Or-Bach et al. |

* cited by examiner

THREE-DIMENSIONAL MEMORY AND OPERATING METHOD THEREOF

BACKGROUND

Technical Field

The present invention relates to a memory and an operating method thereof, and in particular to a three-dimensional (3D) memory with a thyristor configuration and the operating method thereof.

Description of Related Art

With the developments of the process technology, the circuit design and the programming algorithms, the size of the memory device has been greatly reduced in order to achieve higher integration. However, due to the process limitations, the size of the traditional planar memory device cannot meet the needs for size reduction. Therefore, the 3D memory device is currently being developed to solve the problems encountered by the traditional planar memory device.

SUMMARY

The present invention provides a 3D memory and an operating method thereof, wherein the 3D memory has a thyristor configuration.

The 3D memory of the present invention includes a stacked structure, a plurality of annular channel layers, a p-type doped region, an n-type doped region, a source line pillar, a bit line pillar, a first gate insulating layer and a second gate insulating layer. The stacked structure is disposed on a dielectric substrate, and includes a plurality of gate layers and a plurality of insulating layers alternately stacked, wherein each gate layer includes a first gate and a second gate separated from each other. Each annular channel layers corresponds to one of the plurality of gate layers and is disposed between adjacent insulating layers. The p-type doped region is disposed in each annular channel layer and adjacent to the first gate. The n-type doped region is disposed in each annular channel layer and adjacent to the second gate. The source line pillar is disposed on the dielectric substrate, penetrates through the stacked structure, and is located inside the annular channel layer to be in contact with the n-type doped region. The bit line pillar is disposed on the dielectric substrate, penetrates through the stacked structure, and is located inside the annular channel layer to be in contact with the p-type doped region. The first gate insulating layer is disposed between the first gate and the annular channel layer. The second gate insulating layer is disposed between the second gate and the annular channel layer.

In an embodiment of the 3D memory of the present invention, each of a material of the first gate and a material of the second gate includes metal.

In an embodiment of the 3D memory of the present invention, the material of the first gate is the same as the material of the second gate.

In an embodiment of the 3D memory of the present invention, the material of the first gate is different from the material of the second gate.

In an embodiment of the 3D memory of the present invention, a thickness of the first gate insulating layer is the same as a thickness of the second gate insulating layer.

In an embodiment of the 3D memory of the present invention, a thickness of the first gate insulating layer is different from a thickness of the second gate insulating layer.

In an embodiment of the 3D memory of the present invention, each of a material of the source line pillar and a material of the bit line pillar comprises metal or doped polysilicon.

In an embodiment of the 3D memory of the present invention, a material of the annular channel layer comprises undoped polysilicon.

In an embodiment of the 3D memory of the present invention, the 3D memory further includes an insulating pillar disposed on the dielectric substrate, penetrating the stacked structure, and located inside the annular channel layer, wherein the source line pillar and the bit line pillar are located in the insulating pillar.

In an embodiment of the 3D memory of the present invention, the stacked structure has a slit, and the slit penetrates through the stacked structure to separate the first gate from the second gate.

In an embodiment of the 3D memory of the present invention, a width of a portion of the slit corresponding to the gate layer is greater than a width of a portion of the slit corresponding to the insulating layer.

In an embodiment of the 3D memory of the present invention, a portion of the slit corresponding to the gate layer exposes the annular channel layer between the p-type doped region and the n-type doped region.

In an embodiment of the 3D memory of the present invention, the slit exposes a center portion of the annular channel layer.

In an embodiment of the 3D memory of the present invention, the slit exposes a portion of the annular channel layer adjacent the p-type doped region.

In an embodiment of the 3D memory of the present invention, the slit exposes a portion of the annular channel layer adjacent the n-type doped region.

In an embodiment of the 3D memory of the present invention, he 3D memory further includes a separation layer filling the slit.

The operating method of a 3D memory of the present invention is suitable for operating the 3D memory above, wherein each gate layer and the annular channel layer, the p-type doped region, the n-type doped region, the first gate insulating layer and the second gate insulating layer corresponding to the gate layer form a memory cell, and the operating method includes the following steps. A memory cell is selected. A program operation is performed on the selected memory cell. The program operation includes the following steps. A first negative gate voltage is applied to the first gate of the selected memory cell. A first positive gate voltage is applied to the second gate of the selected memory cell. A second negative gate voltage is applied to the first gate of the unselected memory cells. A second positive gate voltage is applied to the second gate of the unselected memory cells. A first bit line positive voltage is applied to the bit line pillar. No voltage is applied to the source line pillar. The first negative gate voltage is less than the second negative gate voltage, and the first positive gate voltage is less than the second positive gate voltage.

In an embodiment of the operating method of present invention, an erase operation is performed on the selected memory cell after the program operation, and the erase operation includes the following steps. No voltage is applied to the first gate of the selected memory cell. No voltage is applied to the second gate of the selected memory cell. A third negative gate voltage is applied to the first gate of the unselected memory cells. A third positive gate voltage is applied to the second gate of the unselected memory cells. No voltage is applied to the bit line pillar. No voltage is applied to the source line pillar. The third negative gate voltage is less than the second negative gate voltage, and the third positive gate voltage is less than the second positive gate voltage.

In an embodiment of the operating method of present invention, a read operation is performed on the selected memory cell after the erase operation, and the read operation includes the following steps. A fourth negative gate voltage is applied to the first gate of the selected memory cell. A fourth positive gate voltage is applied to the second gate of the selected memory cell. A fifth negative gate voltage is applied to the first gate of the unselected memory cells. A fifth positive gate voltage is applied to the second gate of the unselected memory cells. A second bit line positive voltage is applied to the bit line pillar. No voltage is applied to the source line pillar. The fifth negative gate voltage is greater than the third negative gate voltage, the fifth positive gate voltage is greater than the third positive gate voltage, and the second bit line positive voltage is greater than the first bit line positive voltage.

In an embodiment of the operating method of present invention, the fourth negative gate voltage is equal to the first negative gate voltage, the fourth positive gate voltage is equal to the first positive gate voltage, the fifth negative gate voltage is equal to the second negative gate voltage, and fifth positive gate voltage equal to the second positive gate voltage.

DESCRIPTION OF THE EMBODIMENTS

FIGS. 1A to 1J are schematic top views of the manufacturing process of the 3D memory of the embodiment of the present invention. FIGS. 2A to 2J are schematic cross-sectional views of the manufacturing process of the 3D memory along the A-A cross-section in FIGS. 1A to 1J. FIGS. 3A to 3J are schematic cross-sectional views of the manufacturing process of the 3D memory along the B-B cross-section in FIGS. 1A to 1J.

Figure 1A:
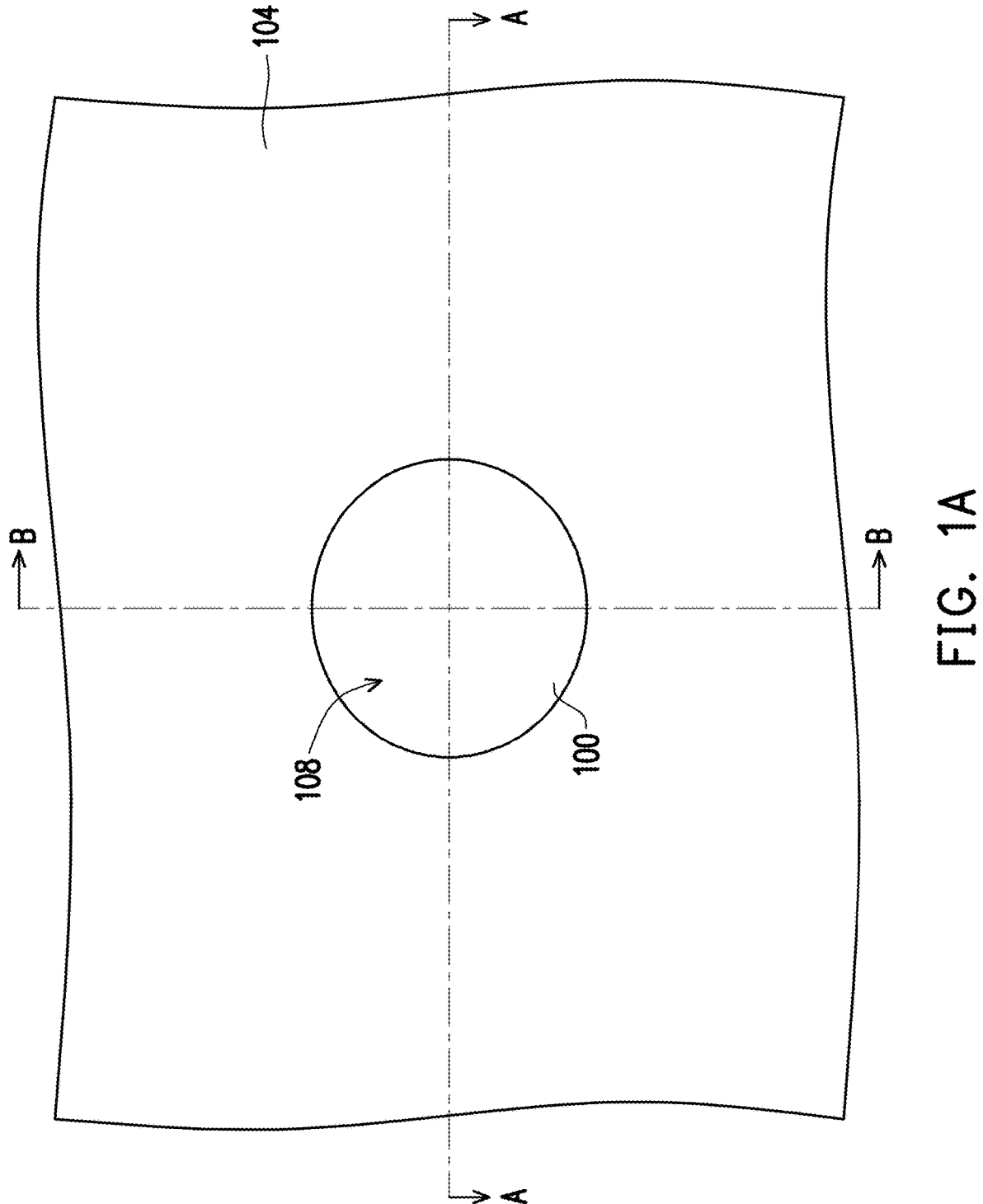
FIGS. 1A to 1J are schematic top views of the manufacturing process of the 3D memory of the embodiment of the present invention.
Figure 2A:
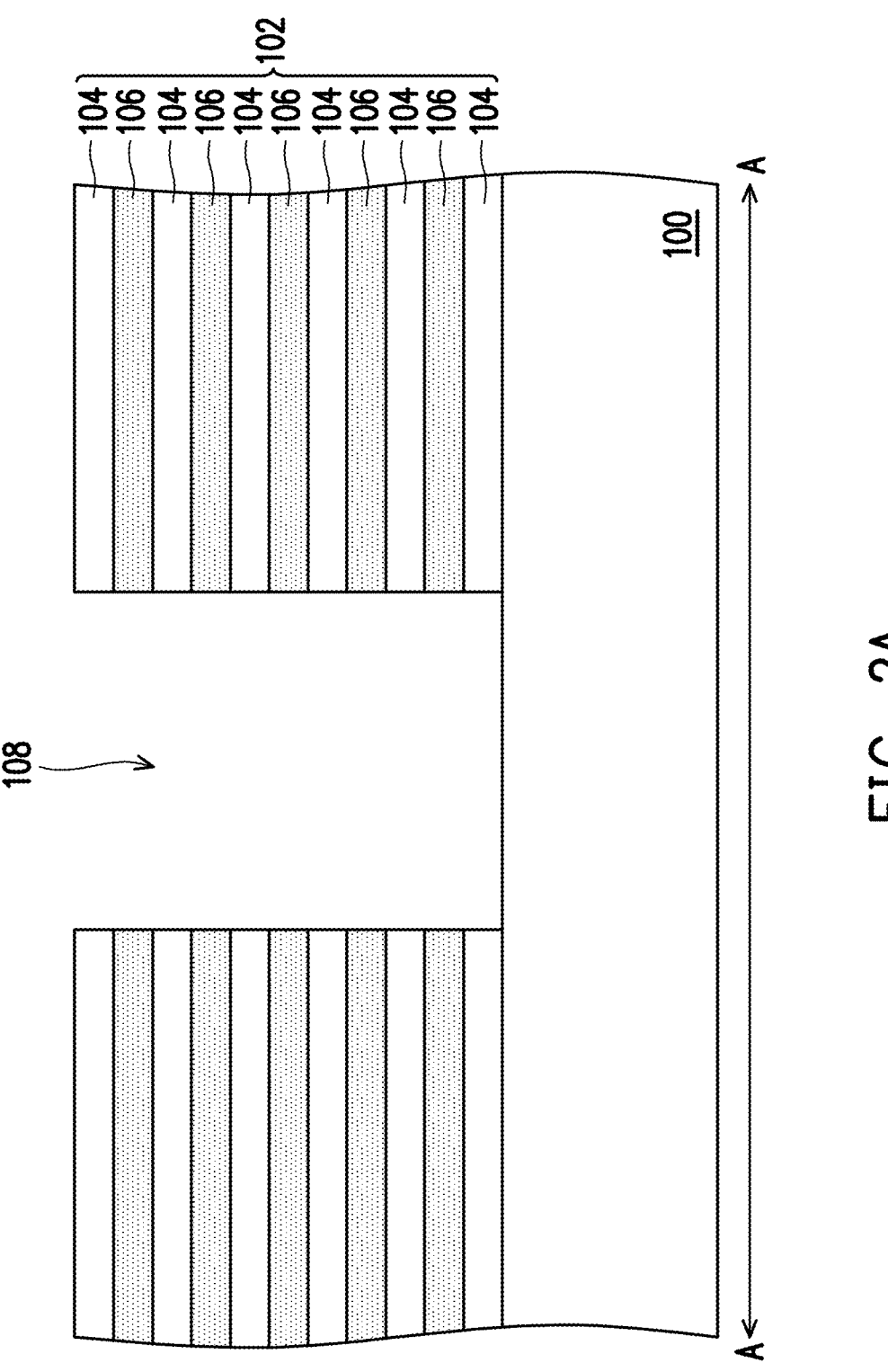
FIGS. 2A to 2J are schematic cross-sectional views of the manufacturing process of the 3D memory along the A-A cross-section in FIGS. 1A to 1J.
Figure 3A:
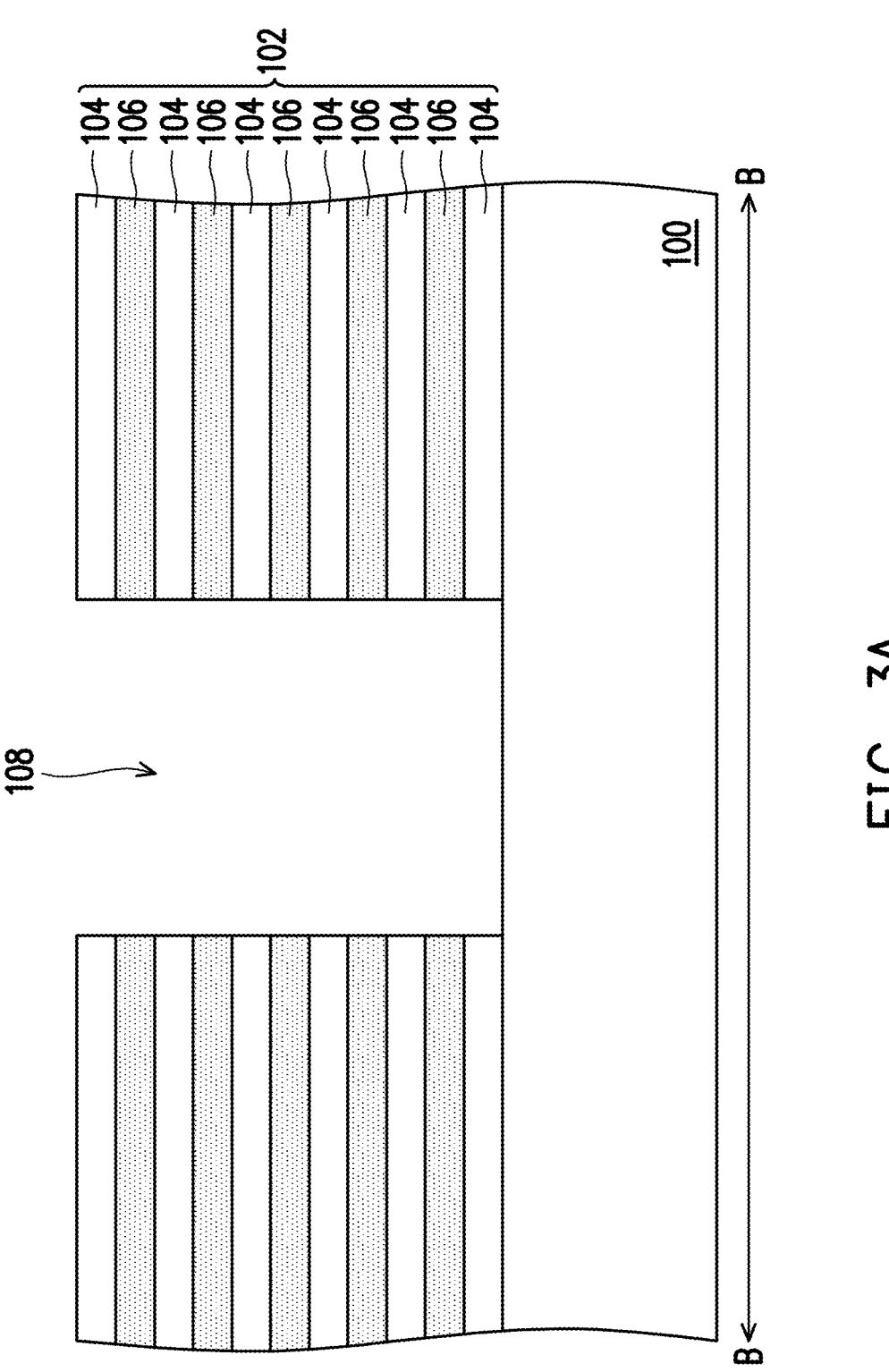
FIGS. 3A to 3J are schematic cross-sectional views of the manufacturing process of the 3D memory along the B-B cross-section in FIGS. 1A to 1J.

Referring to FIGS. 1A, 2A and 3A, an initial stacked structure 102 is formed on a dielectric substrate 100. The dielectric substrate 100 is, for example, a dielectric layer formed on a silicon substrate. The dielectric substrate 100 is, for example, a silicon oxide layer. The initial stacked structure 102 is composed of insulating material layers 104 and sacrificial layers 106 alternately stacked on the dielectric substrate 100. The insulating material layer 104 is, for example, a silicon oxide layer. The sacrificial layer 106 is, for example, a silicon nitride layer. In the present embodiment, the initial stacked structure 102 has 6 layers of insulating material layer 104 and 5 layers of sacrificial layer 106, and the lowermost layer and the uppermost layer are insulating material layers 104, but the present invention is not limited thereto. In other embodiments, more layers of insulating material layer 104 and more layers of sacrificial layer 106 may be formed according to actual needs.

Next, a hole 108 is formed in the initial stacked structure 102. In the present embodiment, the hole 108 exposes the dielectric substrate 100, but the present invention is not limited thereto. In other embodiments, the bottom of the hole 108 may be located in the lowest insulating material layer 104. That is, the hole 108 does not expose the dielectric substrate 100. Alternatively, the bottom of the hole 108 may be located in dielectric substrate 100. From the top view of the dielectric substrate 100, the hole 108 may have a circular or other shaped profile.

Figure 1B:
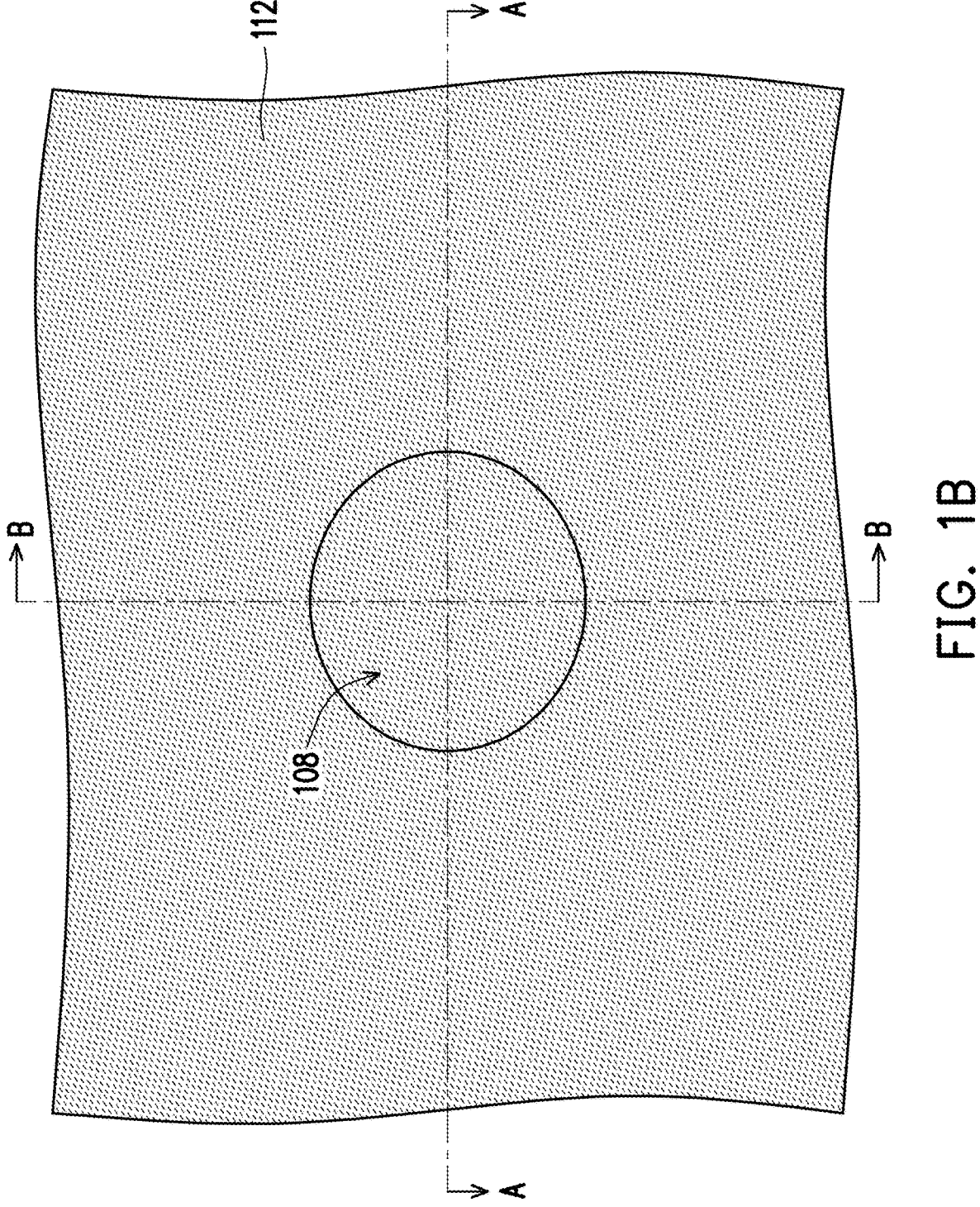
Figure 2B:
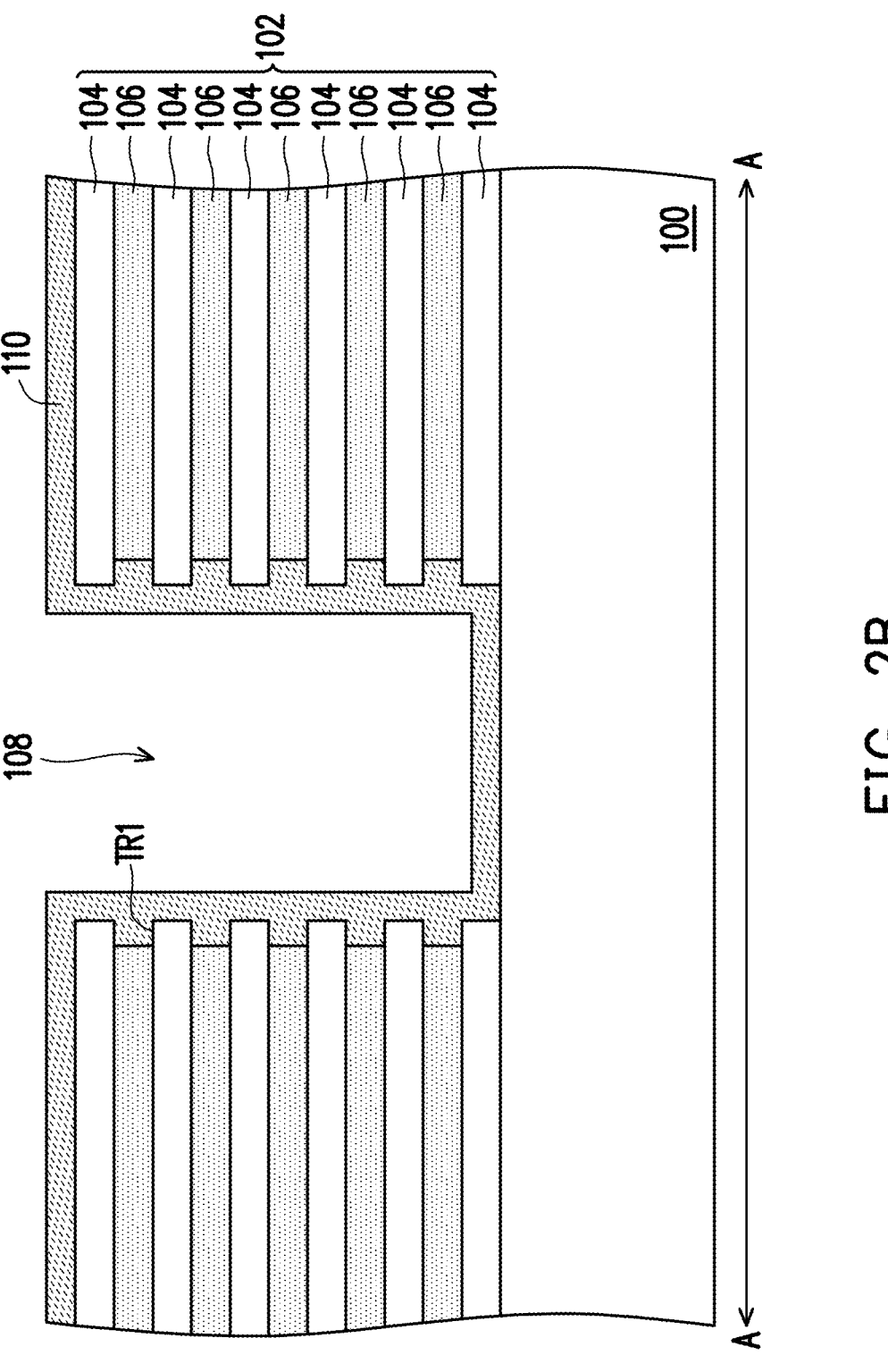
Figure 3B:
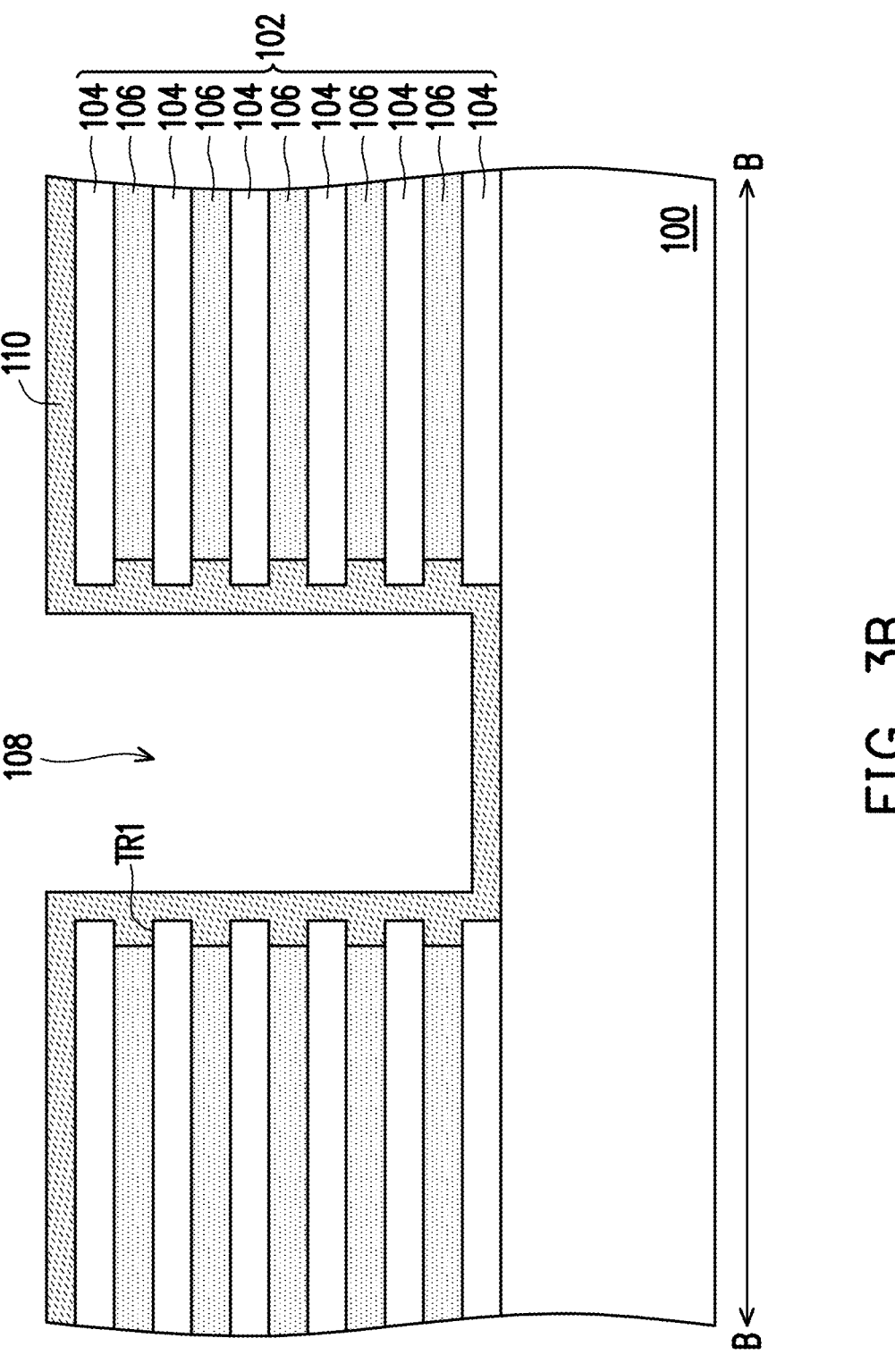

Referring to FIGS. 1B, 2B and 3B, an etching process is performed through the hole 108 to remove a part of each sacrificial layer 106 from the surface of the sacrificial layer 106 exposed by the hole 108 toward the inside of the sacrificial layer 106. In this way, a trench TR1 is formed between adjacent insulating material layers 104. The trenches TR1 define the positions of the channels of the 3D memory of the present embodiment.

Afterwards, a channel material layer 110 is conformally formed on the dielectric substrate 100. The channel material layer 110 covers the surface of the initial stacked structure 102, the sidewall and the bottom of the hole 108 and the dielectric substrate 100 exposed by the hole 108, and fills the trenches TR1. The channel material layer 110 is, for example, an undoped polysilicon layer.

Figure 1C:
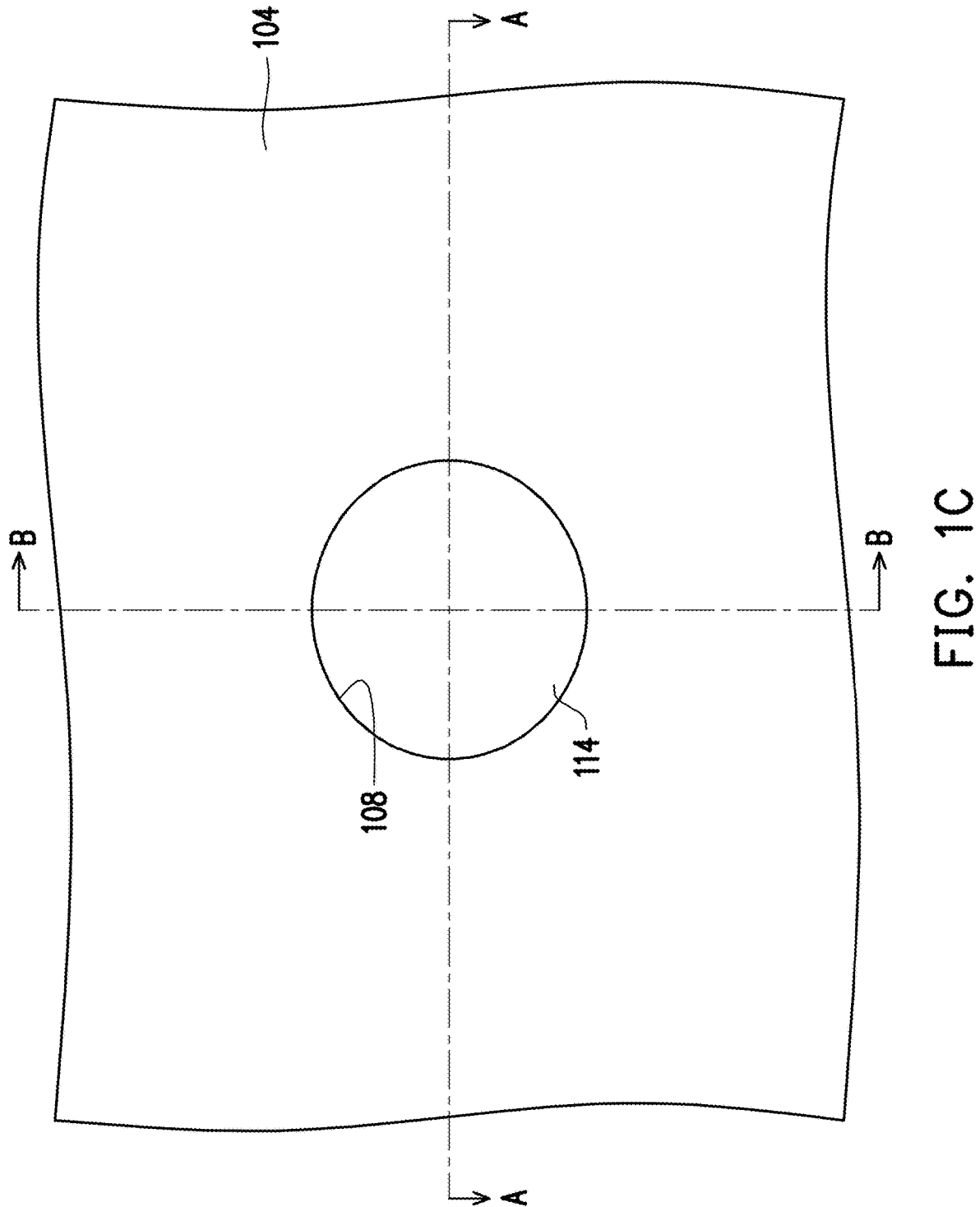
Figure 2C:
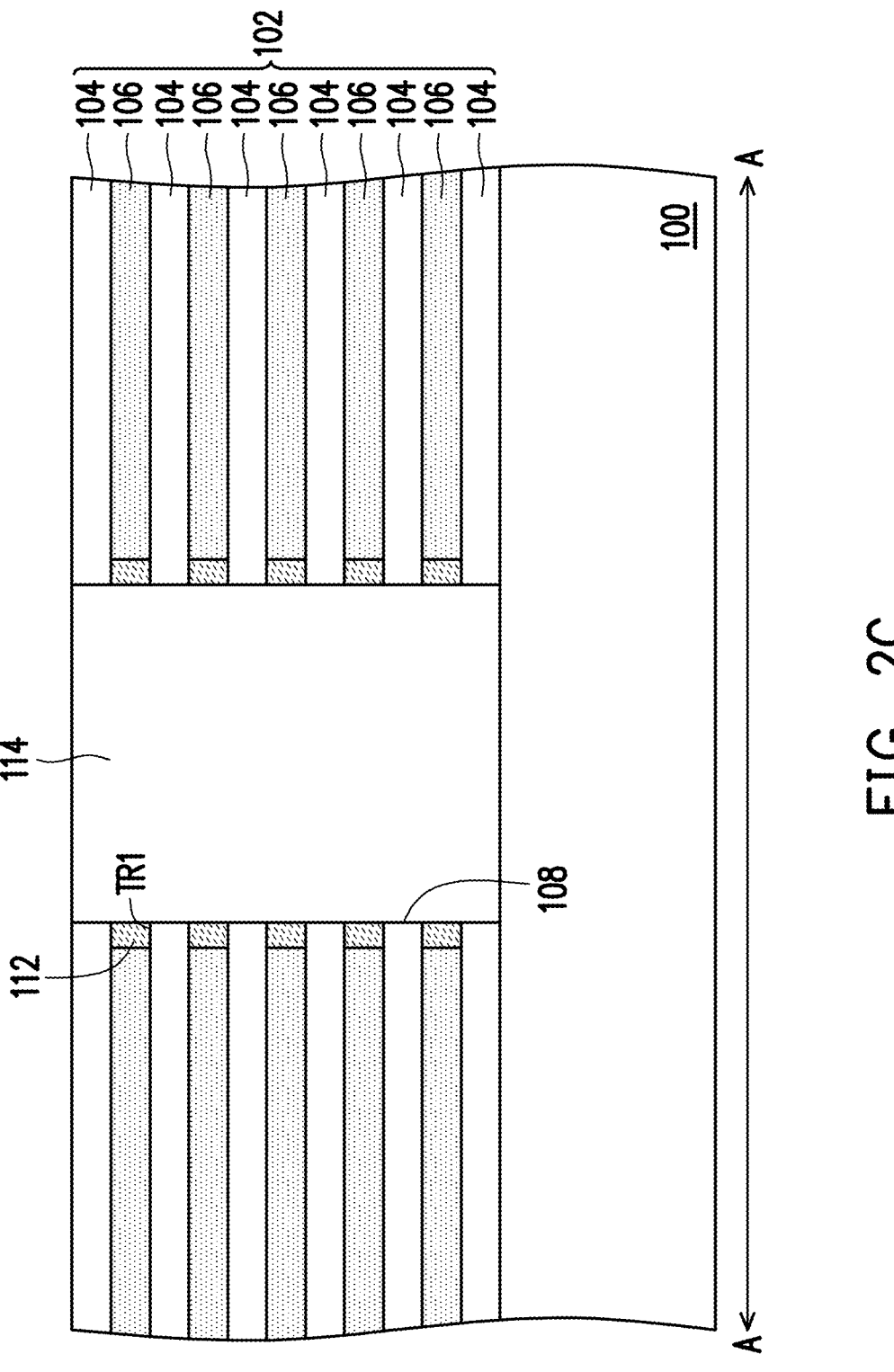
Figure 3C:
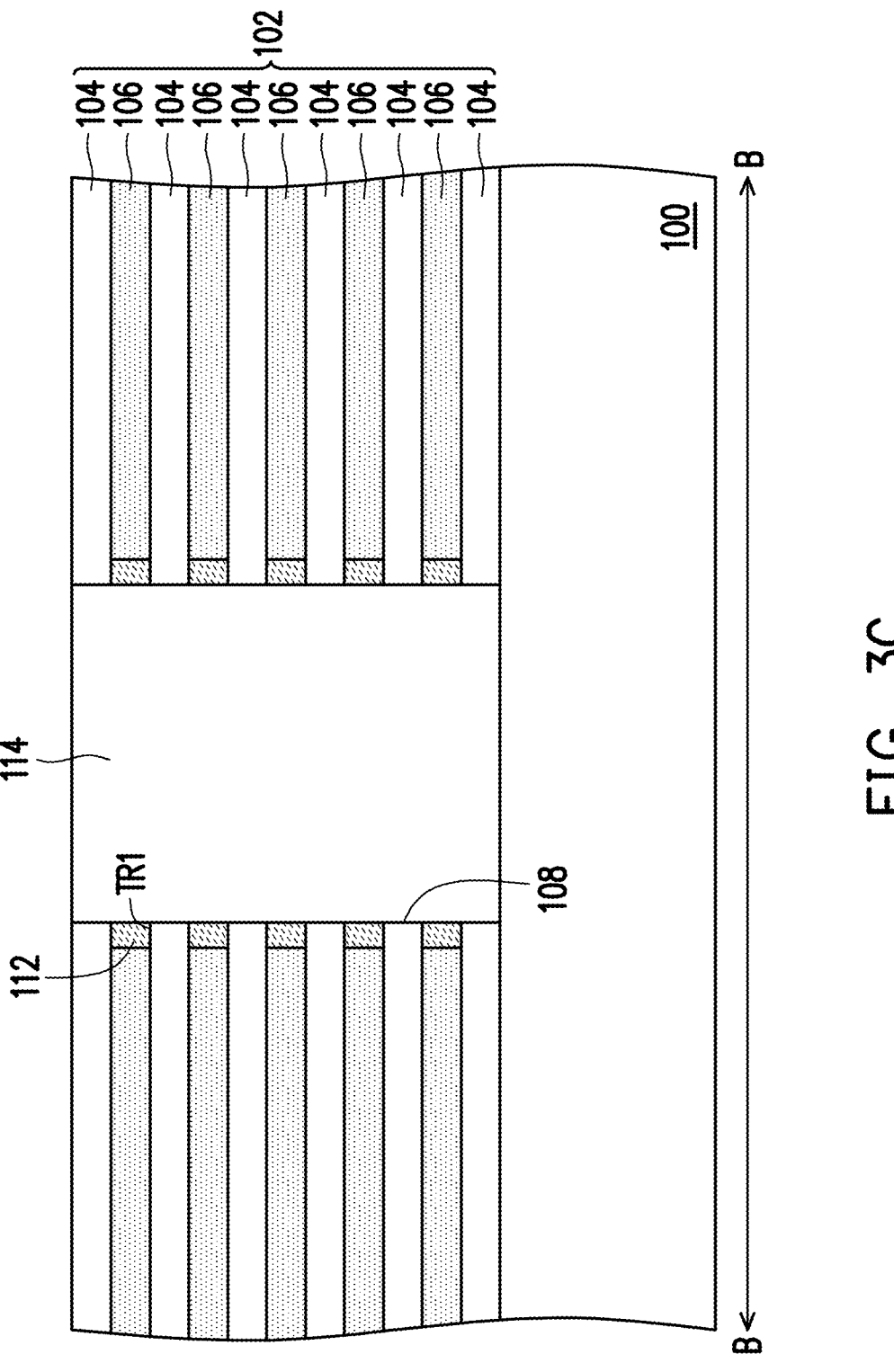

Referring to FIGS. 1C, 2C and 3C, an anisotropic etching process is performed to remove the channel material layer 110 on the top surface of the initial stacked structure 102 and on the sidewall and the bottom of the hole 108, while retaining the channel material layer 110 in the trenches TR1. In this way, annular channel layers 112 located in trenches TR1 are formed.

After that, an insulating layer 114 is formed in the hole 108. The insulating layer 114 fills hole 108. The insulating layer 114 is, for example, a silicon oxide layer. The forming method of the insulating layer 114 may include the following steps. An insulating material layer is formed on the dielectric substrate 100 to cover the surface of the initial stacked structure 102 and fill the hole 108. The insulating material layer outside the hole 108 is removed.

Figure 1D:
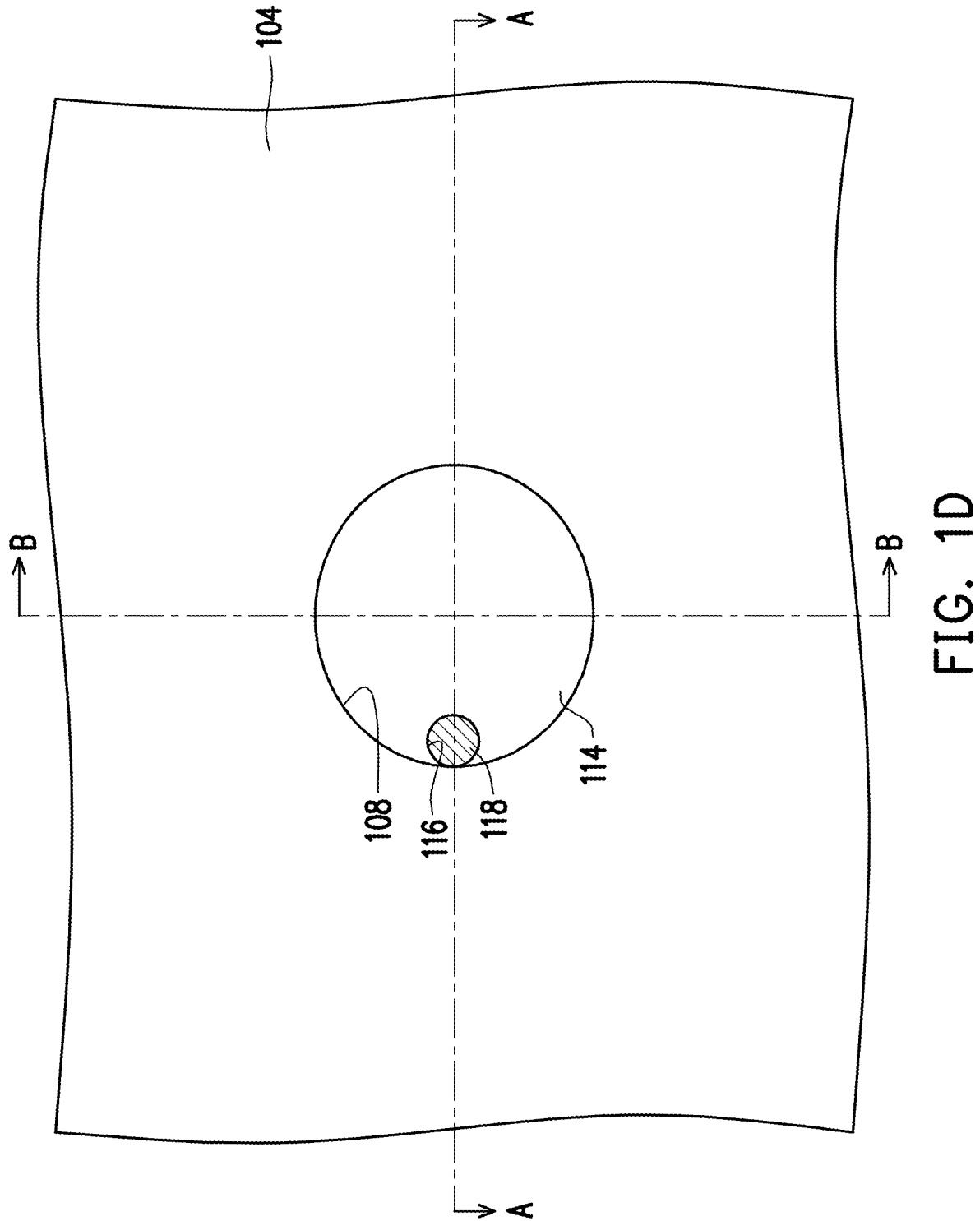
Figure 2D:
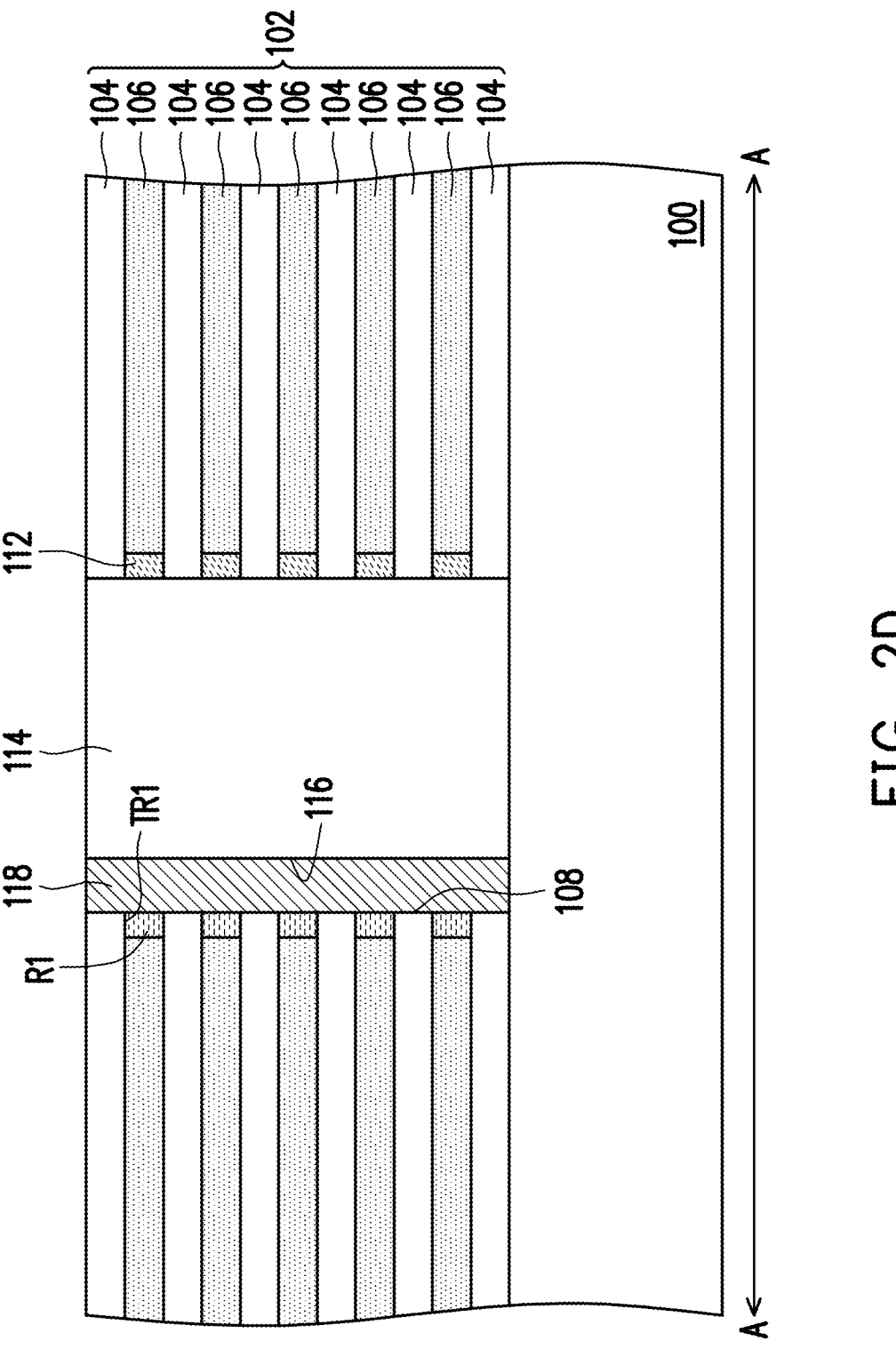
Figure 3D:
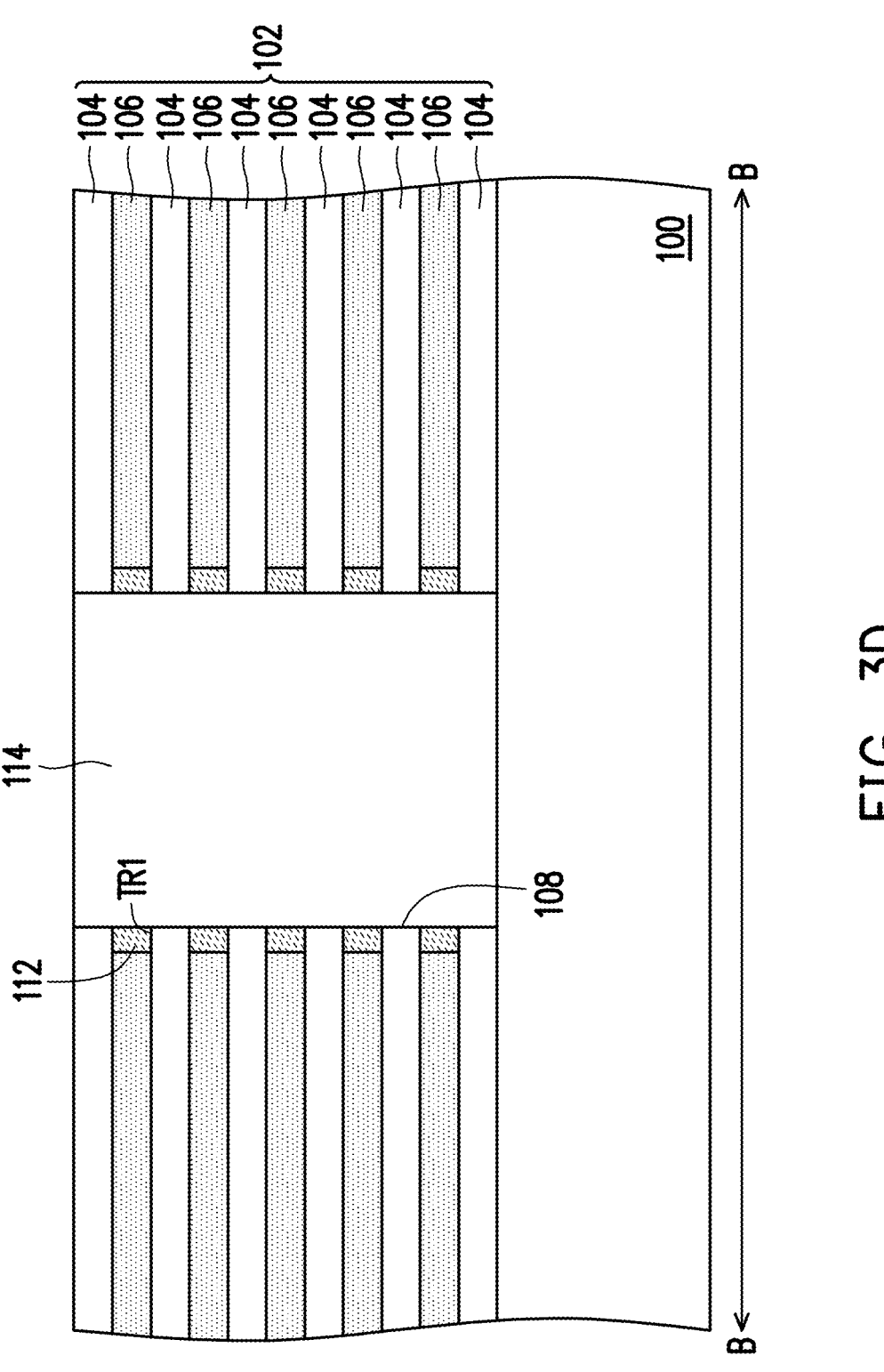

Referring to FIGS. 1D, 2D and 3D, a hole 116 is formed in the insulating layer 114. On one side of the insulating layer 114, the hole 116 penetrates through the insulating layer 114 and exposes each channel layer 112 and the dielectric substrate 100. From the top view of the dielectric substrate 100, the hole 116 may have a circular or other shaped profile. Next, an ion implant process is performed, and ions of a first conductive type are implanted into the channel layers 112 from the surfaces of the channel layers 112 exposed by the hole 116 to form first doped regions R1 of the first conductive type. In the present embodiment, the first conductivity type is p-type, but the present invention is not limited thereto. In another embodiment, the first conductivity type may be n-type. Afterwards, a conductive layer 118 is formed in hole 116. The conductive layer 118 fills the hole 116 and contacts the first doped regions R1. The conductive layer 118 is, for example, a metal layer or a doped polysilicon layer.

Figure 1E:
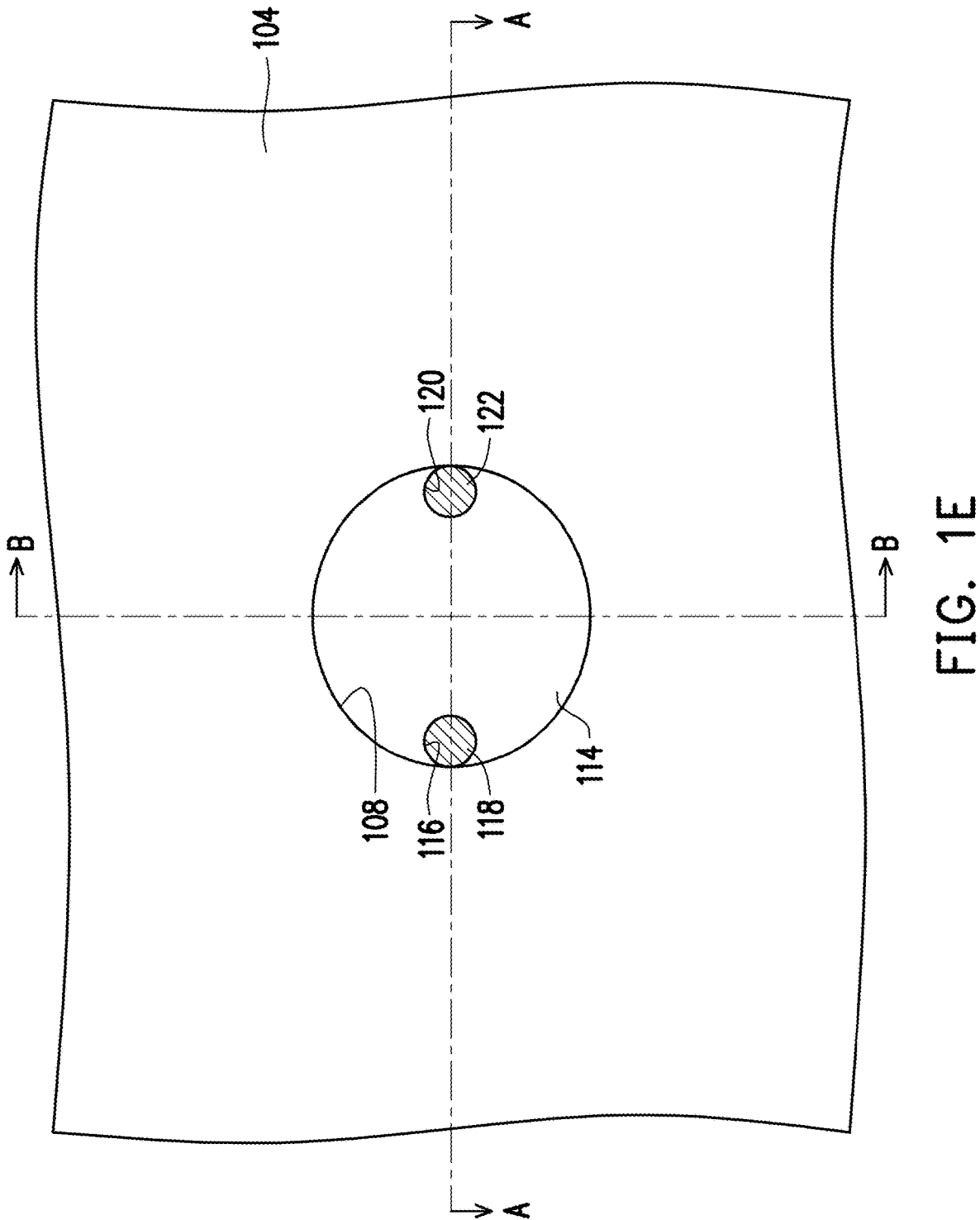
Figure 2E:
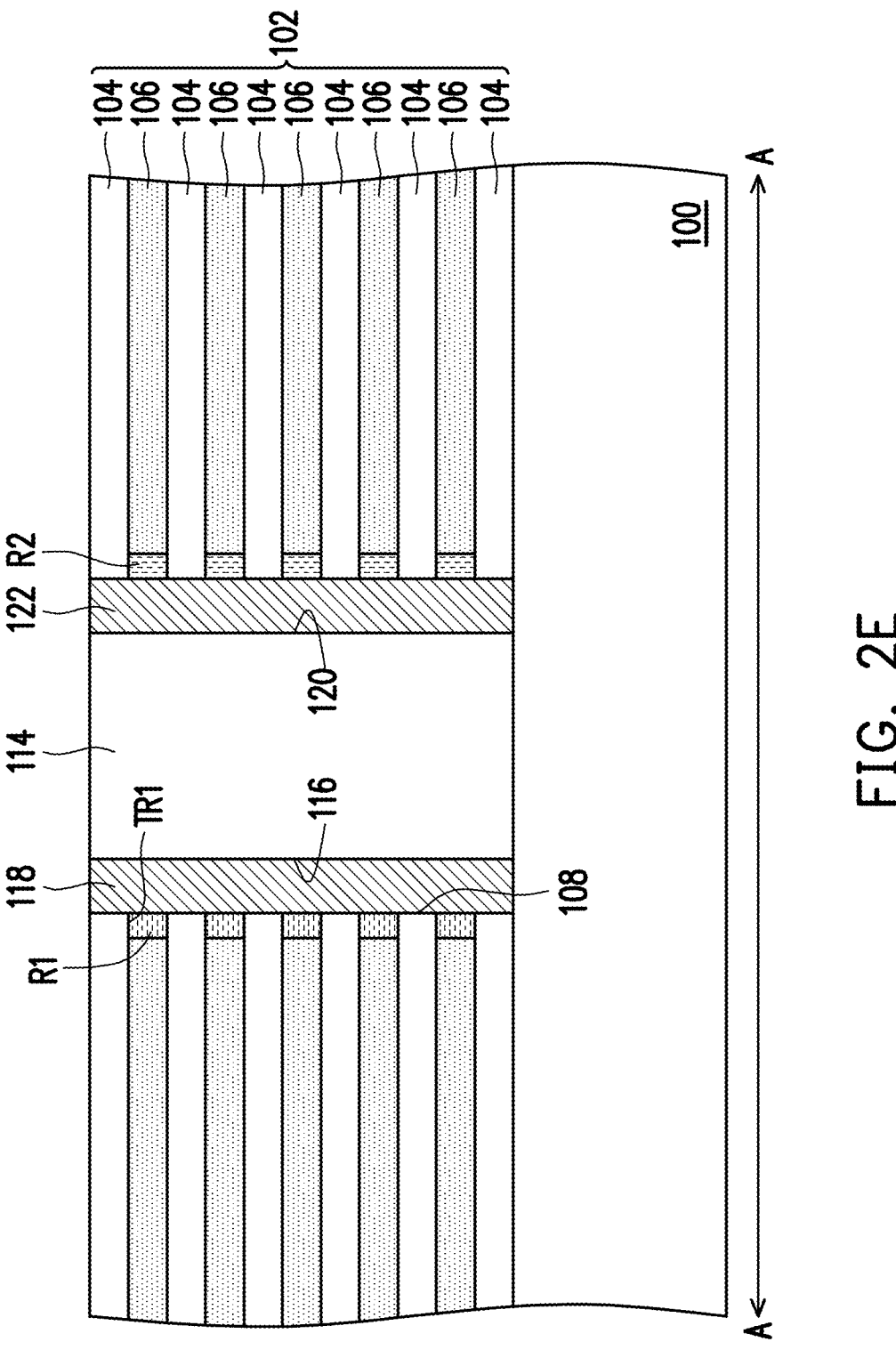
Figure 3E:
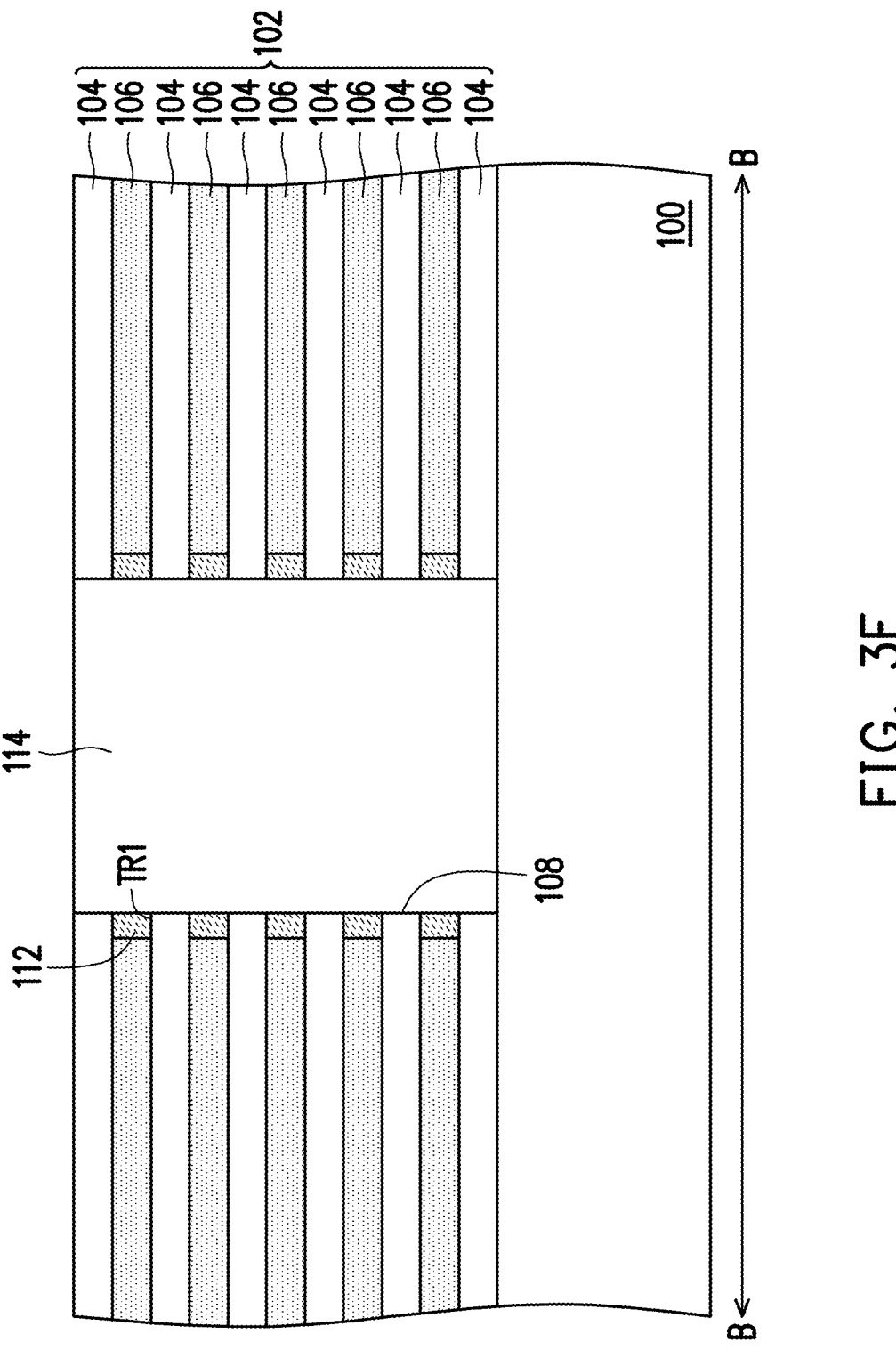

Referring to FIGS. 1E, 2E and 3E, a hole 120 is formed in the insulating layer 114. On the other side of the insulating layer 114, the hole 120 penetrate through the insulating layer 114 and expose each channel layer 112 and the dielectric substrate 100. From the top view of the dielectric substrate 100, the hole 120 may have a circular or other shaped profile. Next, an ion implant process is performed, and ions of a second conductive type are implanted into the channel layers 112 from the surfaces of the channel layers 112 exposed by the hole 120 to form second doped regions R2 of the second conductive type. In the present embodiment, the second conductivity type is n-type. After that, a conductive layer 122 is formed in the hole 120. The conductive layer 122 fills the hole 120 and contacts the second doped regions R2. The conductive layer 122 is, for example, a metal layer or a doped polysilicon layer.

In the present embodiment, the first doped region R1 is p-type to be used as a drain region, while the second doped region R2 is n-type to be used as a source region. In addition, the conductive layer 118 is located inside the annular channel layers 112 and in contact with the drain regions, and therefore may be used as a bit line pillar. The conductive layer 122 is located inside the annular channel layers 112 and in contact with the source regions, and therefore may serve as a source line pillar. The undoped channel layer 112 between the source region and the drain region may be used as a channel region.

In addition, in the present embodiment, the source line pillar and the bit line pillar are formed on the dielectric substrate 100 and penetrate through the initial stacked structure 102, and are respectively located on opposite sides of the insulating layer 114, but the present invention is not limited thereto. In other embodiments, as long as the source line pillar and the bit line pillar may be separated by an appropriate distance.

Figure 1F:
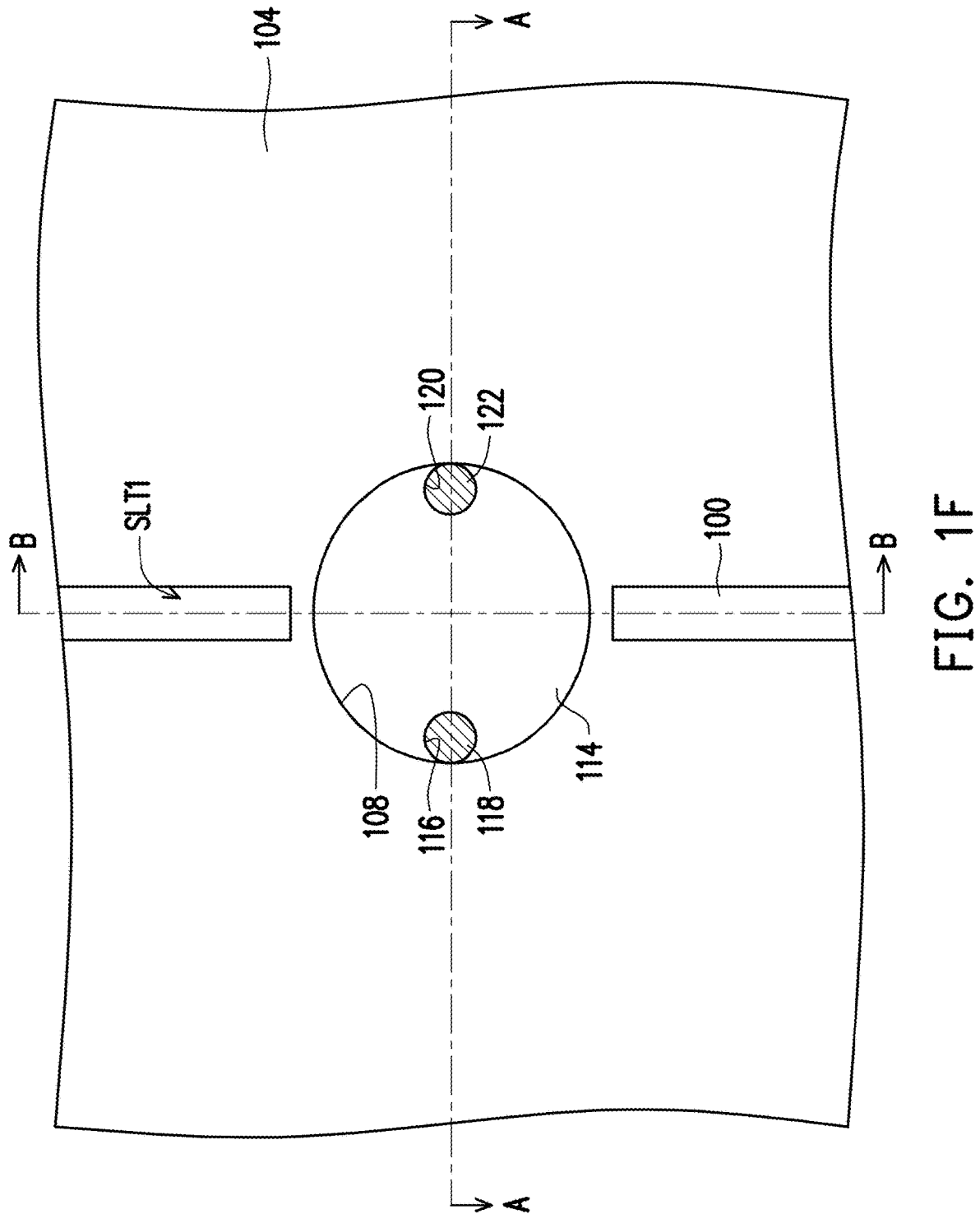
Figure 2F:
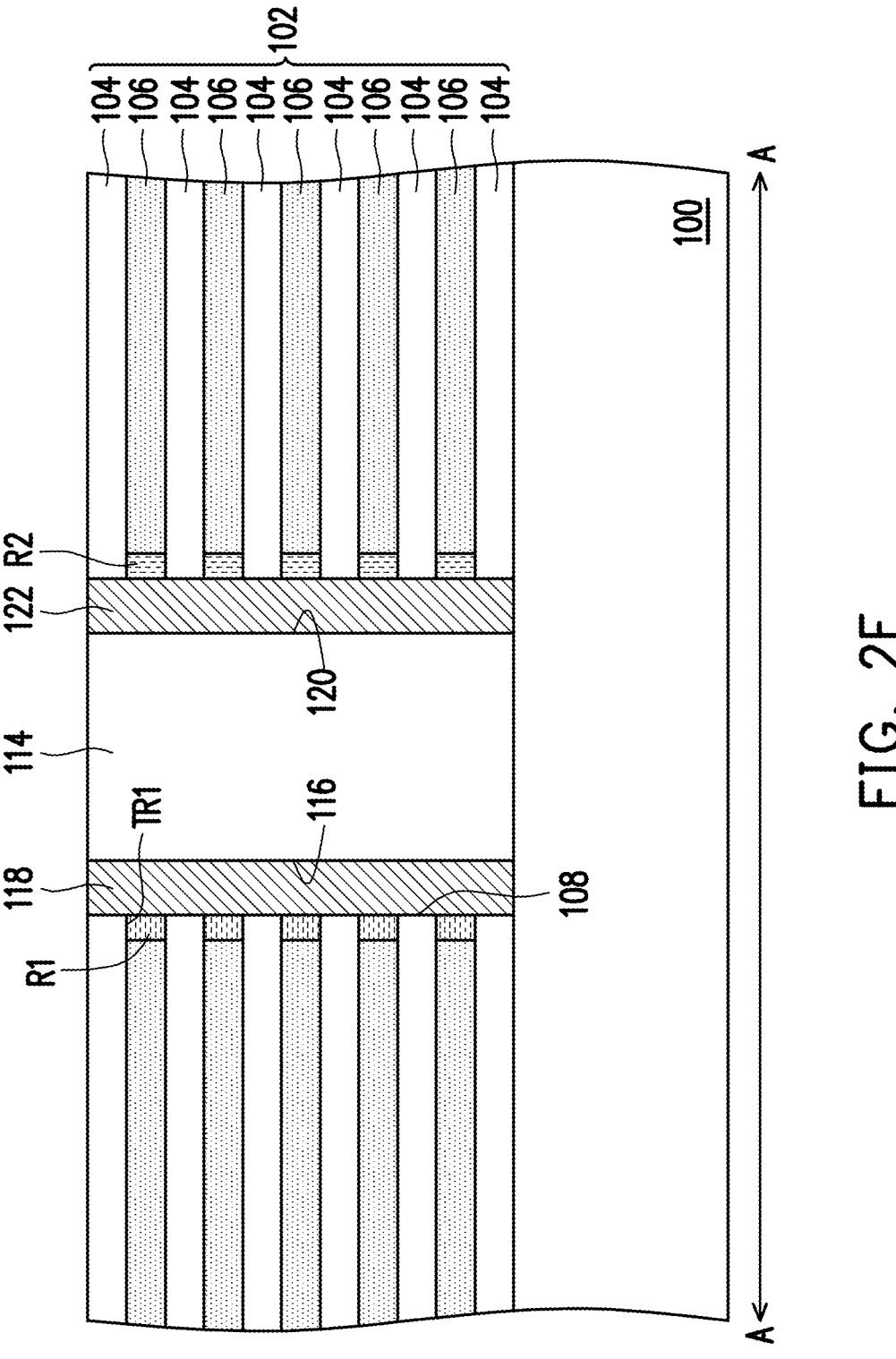
Figure 3F:
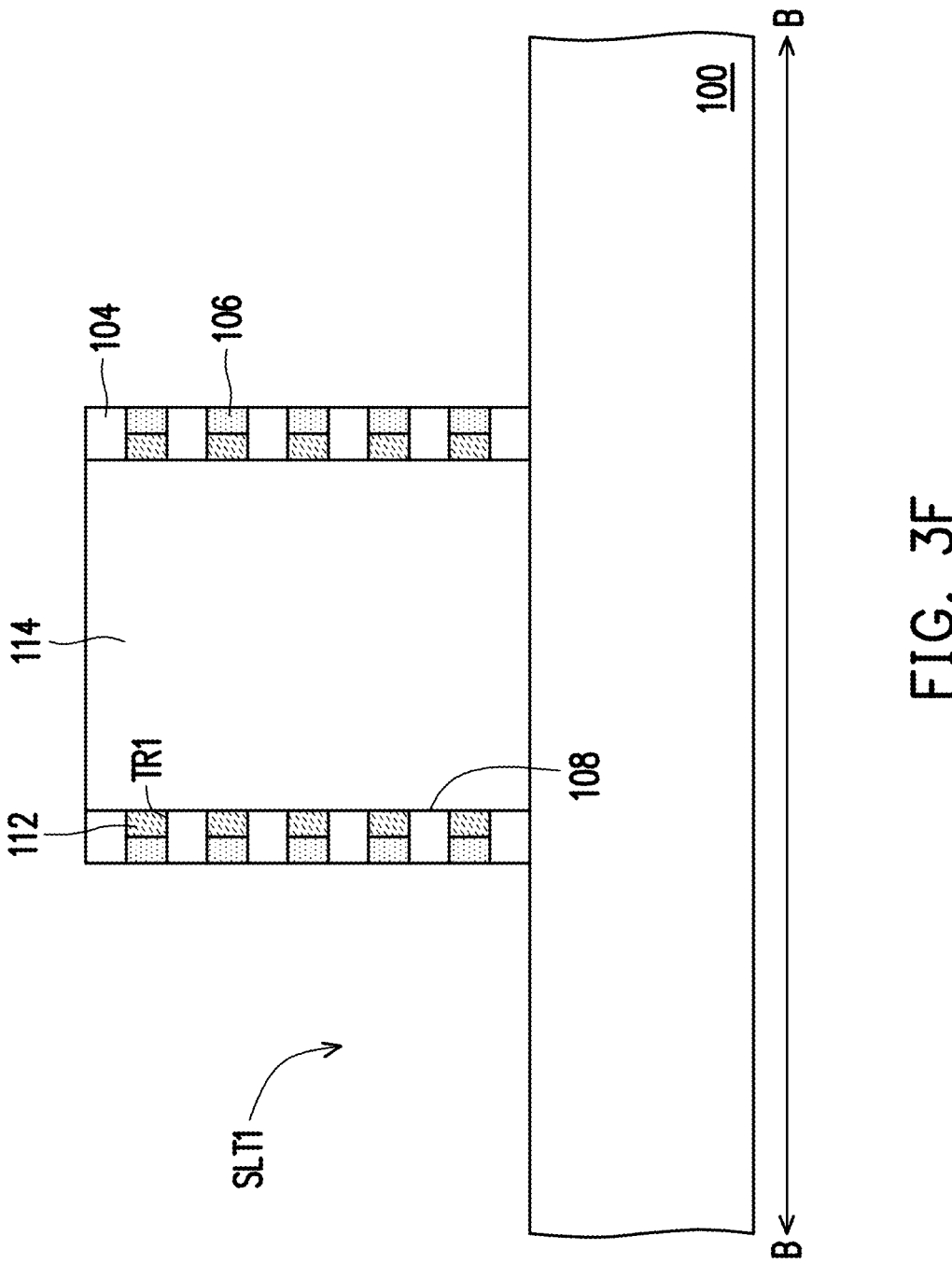

Referring to FIGS. 1F, 2F and 3F, a part of the initial stacked structure 102 is removed to form slits SLT1 exposing the dielectric substrate 100. Specifically, in the present embodiment, the slits SLT1 are formed on opposite sides of the hole 108 in a direction intersecting with the connecting direction of the hole 118 and the hole 120, and the slits SLT1 do not expose the channel layers 112. In other words, the hole 118 and the hole 120 are located on opposite sides of the slits SLT1 in a direction intersecting with the extending direction of the slits SLT1.

In addition, in the present embodiment, as shown in FIG. 1F, the slits SLT1 divide the initial stacked structure 102 into two symmetric regions, i.e., a region on the left side of the slits SLT1 and a region on the right side of the slits SLT1, but the present invention is not limited thereto. In other embodiments, depending on actual needs, the left region and the right region may be asymmetrical. That is, the area of the left region may be different from the area of the right region.

Figure 1G:
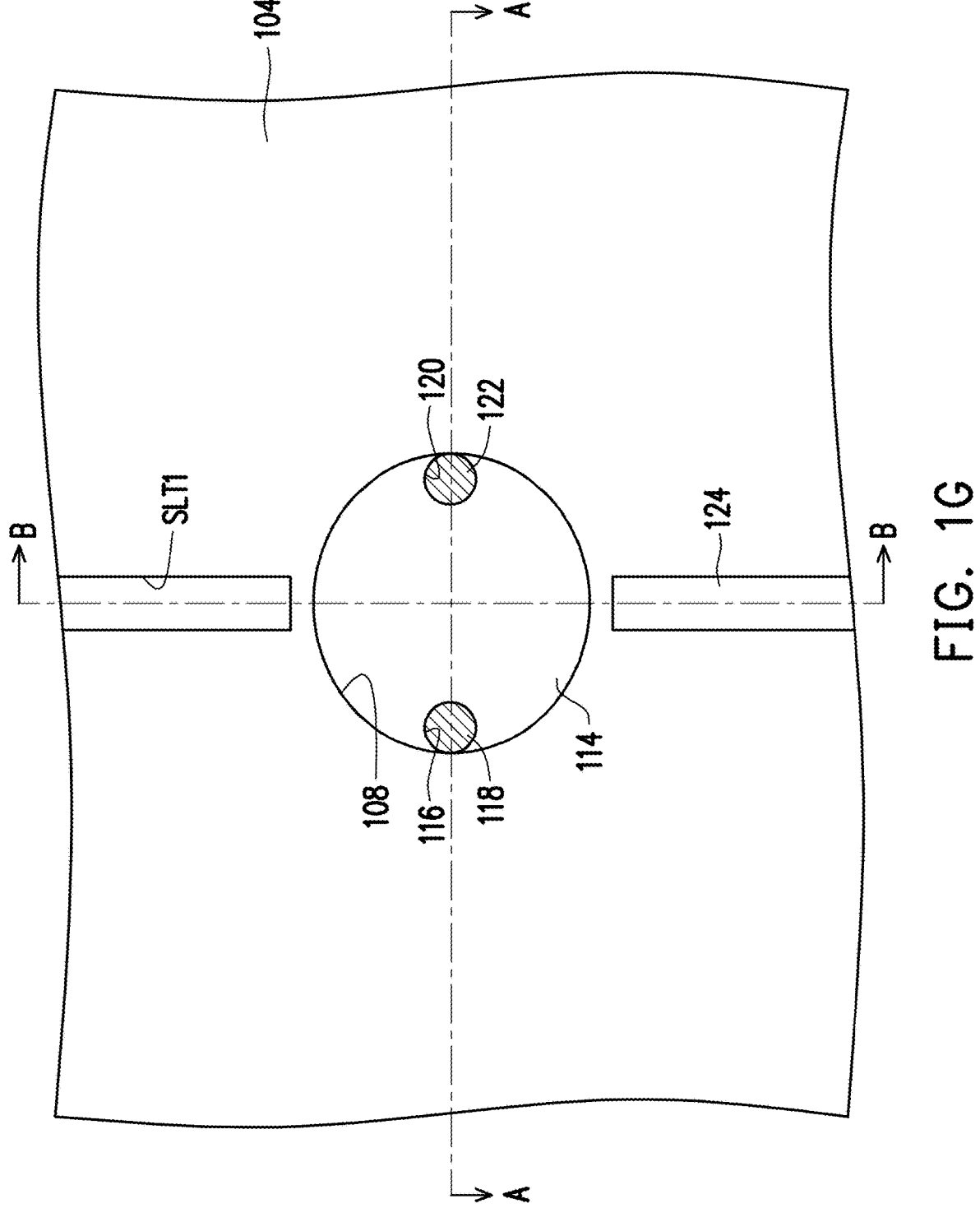
Figure 2G:
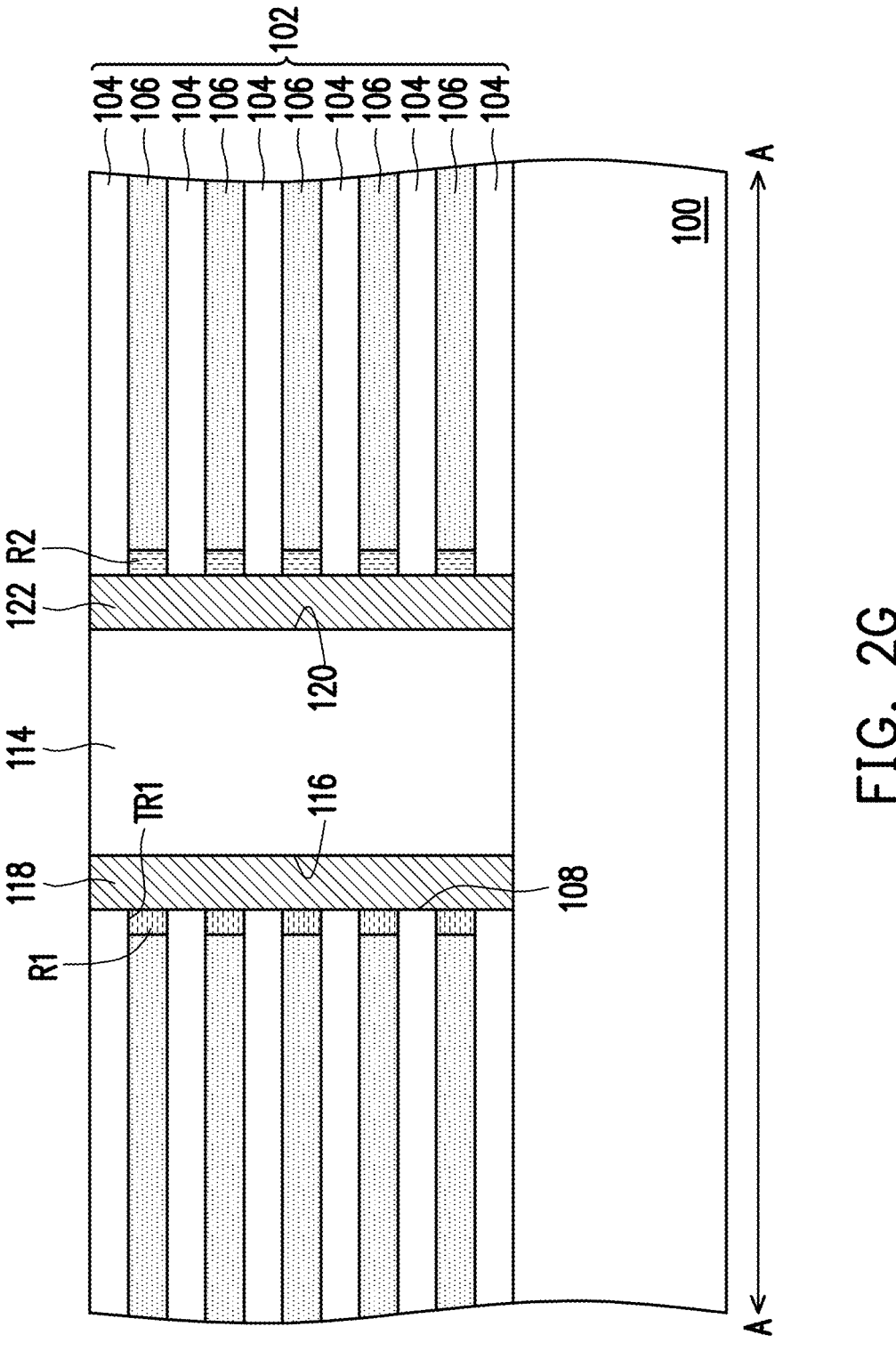
Figure 3G:
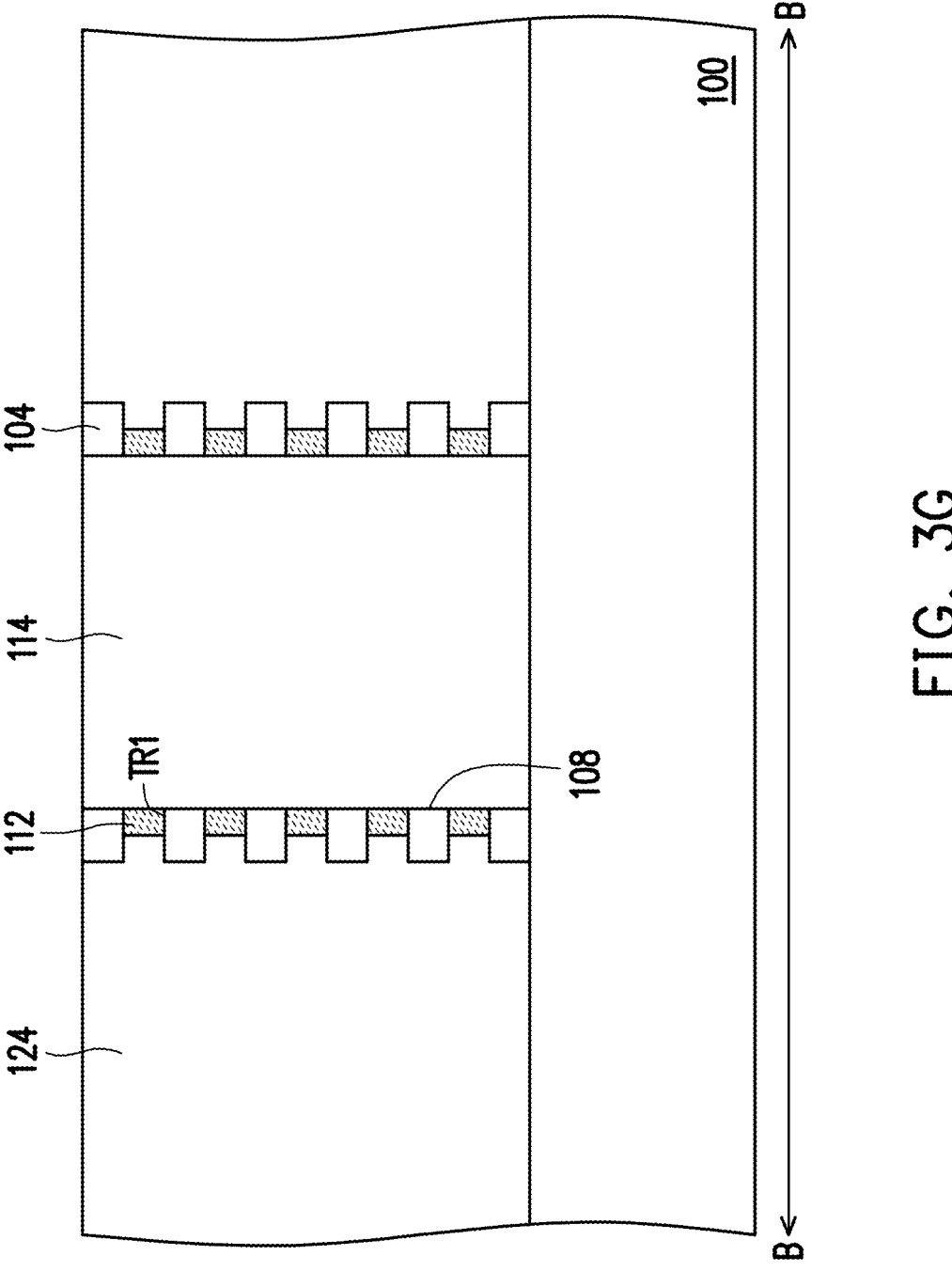

Referring to FIGS. 1G, 2G and 3G, an etching process is performed through slit SLT1 to remove a part of each sacrificial layer 106 until the channel layers 112 are exposed. As a result, each channel layer 112 is exposed between adjacent insulating material layers 104 in the extending direction of the slits SLT1. After that, an insulating layer 124 is filled in the slits SLT1 as a separation layer. The insulating layer 124 is, for example, a silicon oxide layer. The forming method of the insulating layer 124 may include the following steps. An insulating material layer is formed on the dielectric substrate 100 to cover the surface of the initial stacked structure 102 and fill the slits SLT1. The insulating material layer outside the slits SLT1 is removed.

Figure 1H:
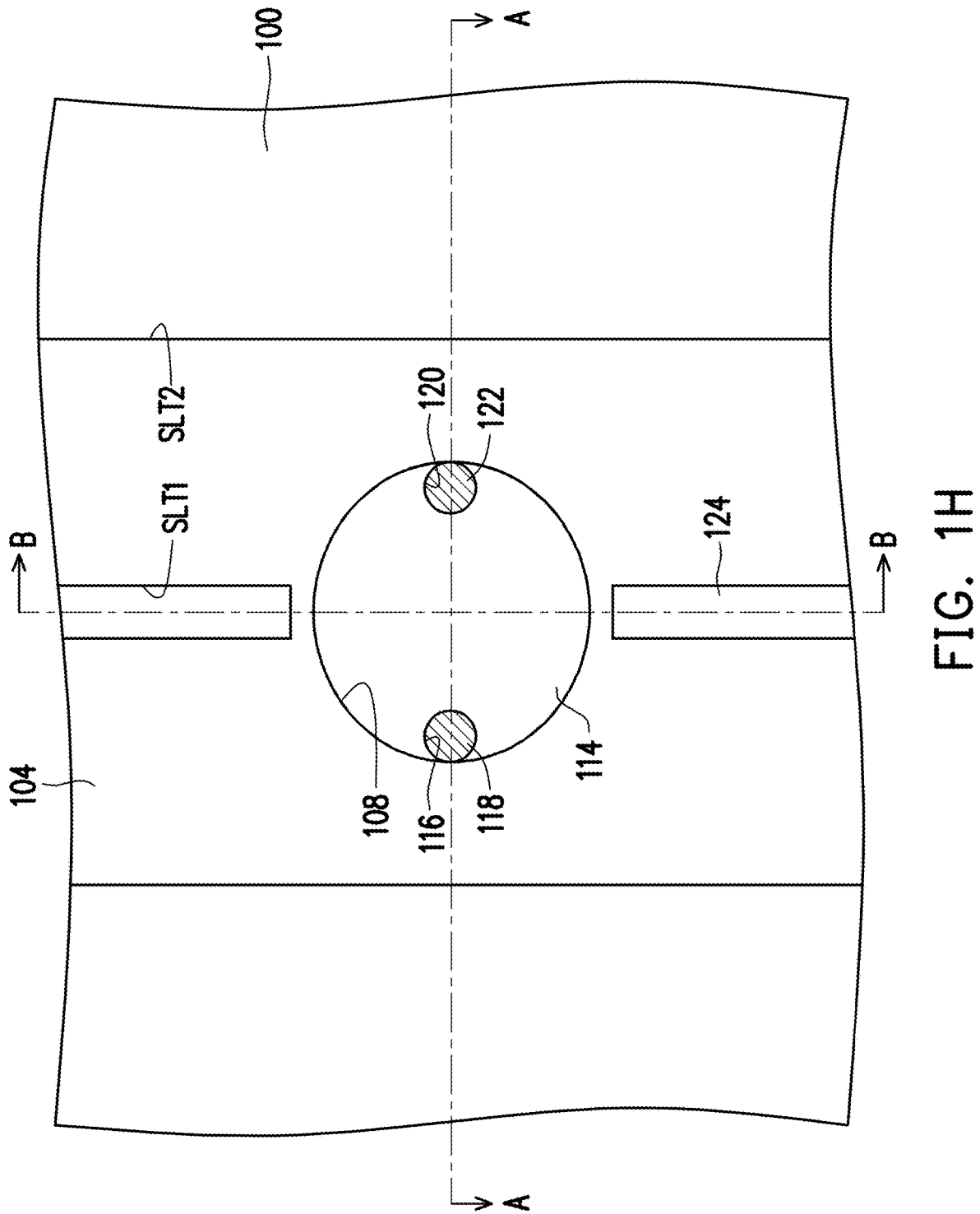
Figure 2H:
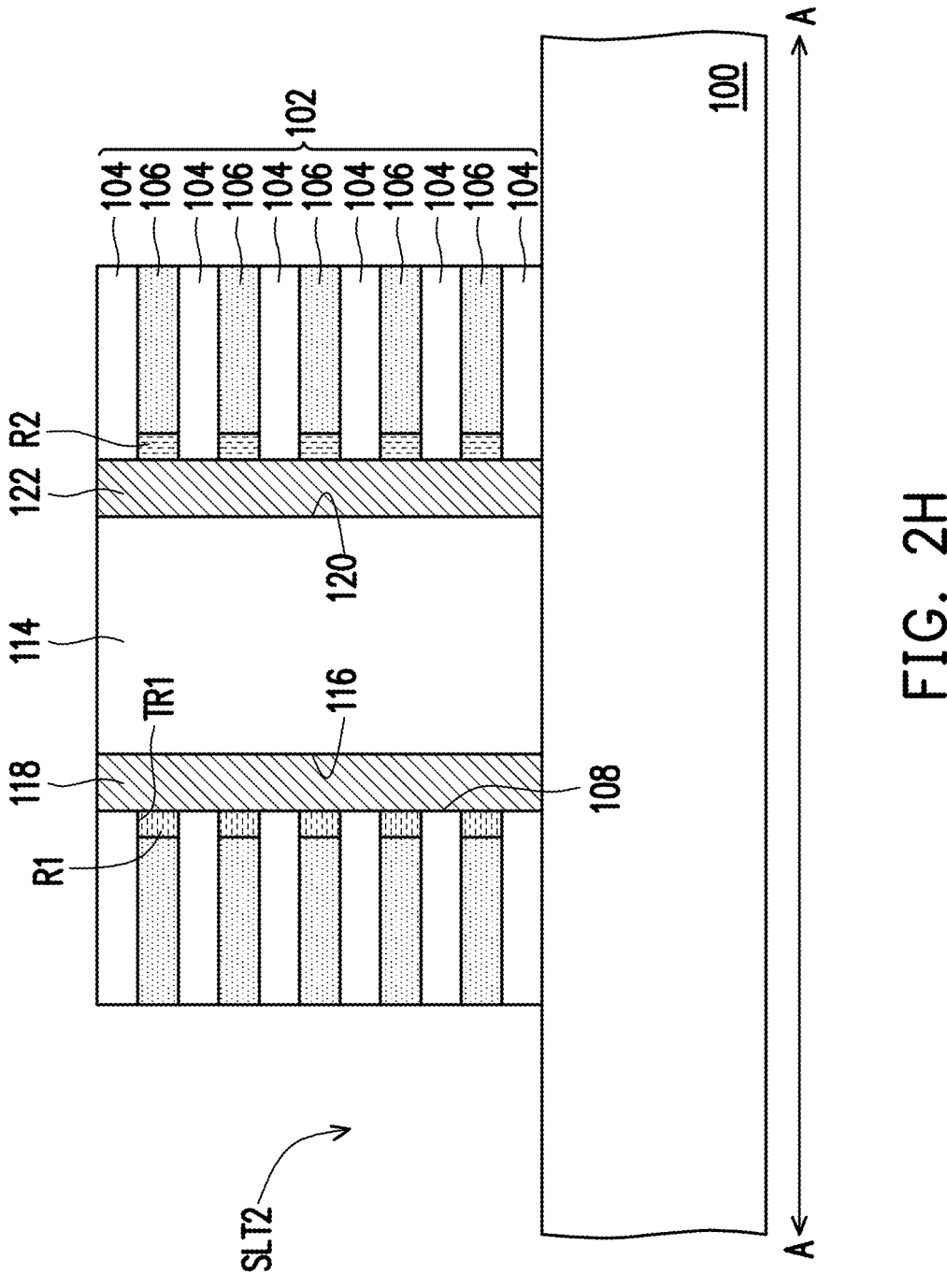
Figure 3H:
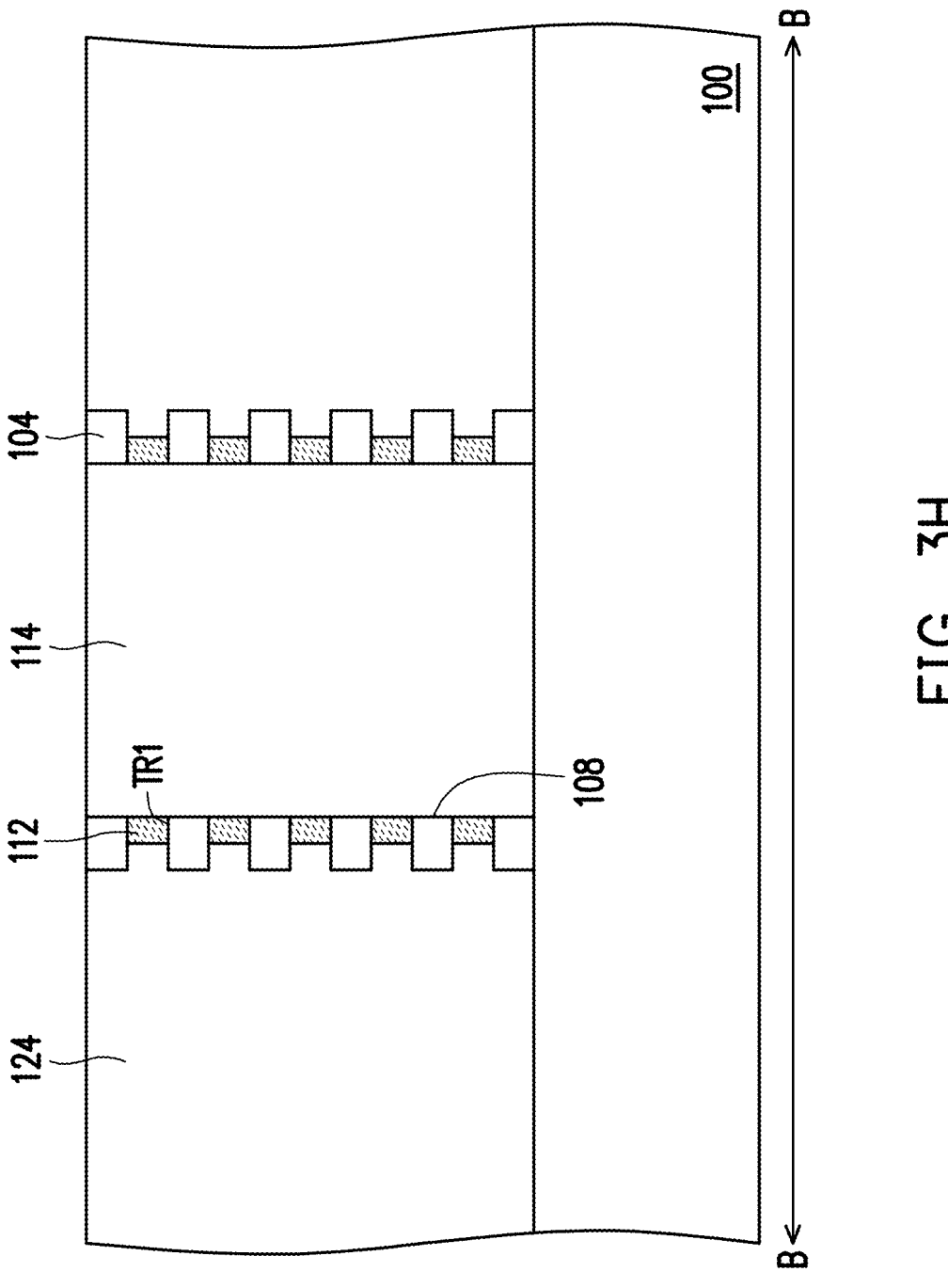

Referring to FIGS. 1H, 2H and 3H, a part of the initial stacked structure 102 is removed to form slits SLT2 exposing the dielectric substrate 100. In the present embodiment, the extending direction of the slits SLT2 is parallel to the extending direction of the slits SLT1.

Figure 1I:
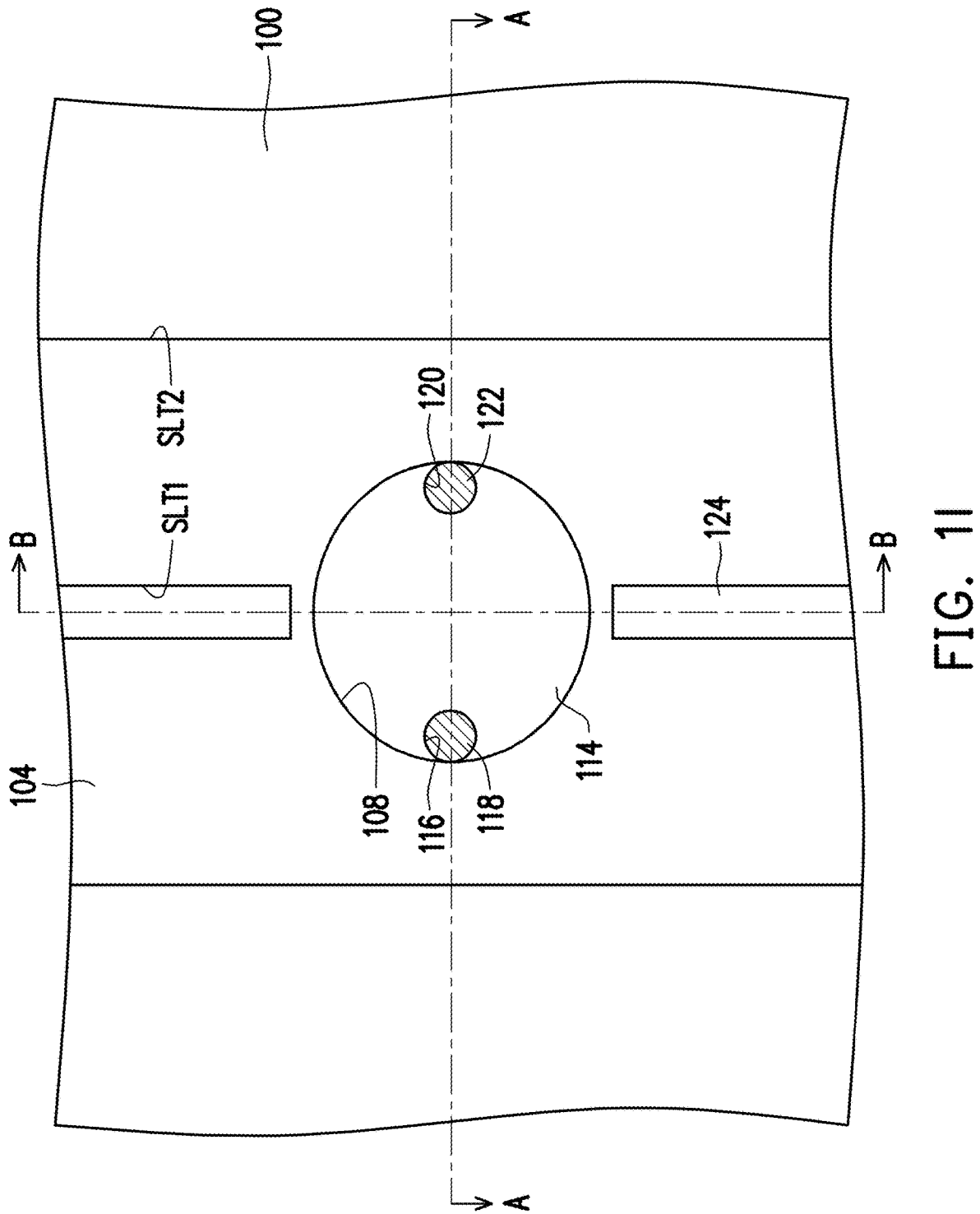
Figure 2I:
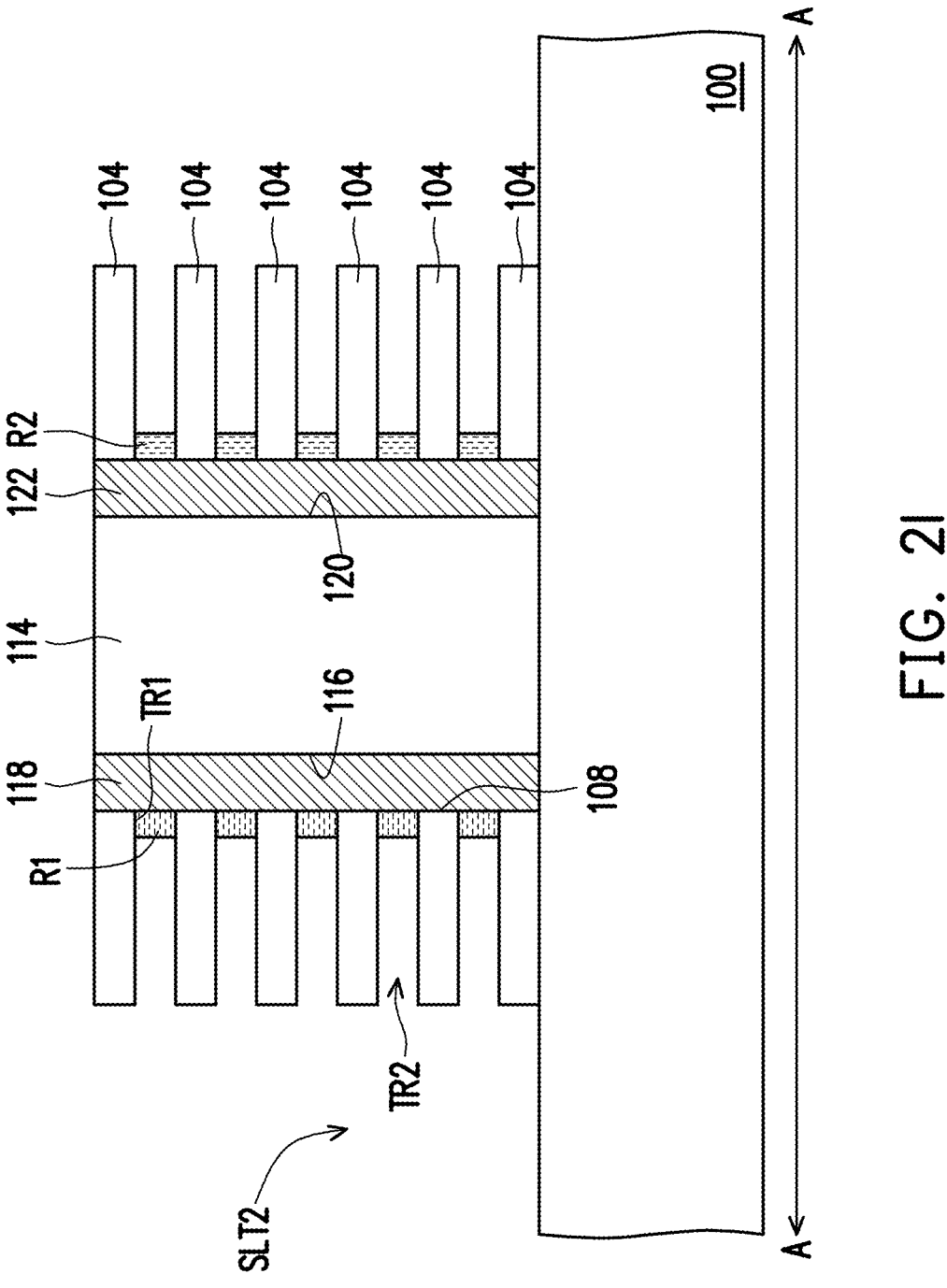
Figure 3I:
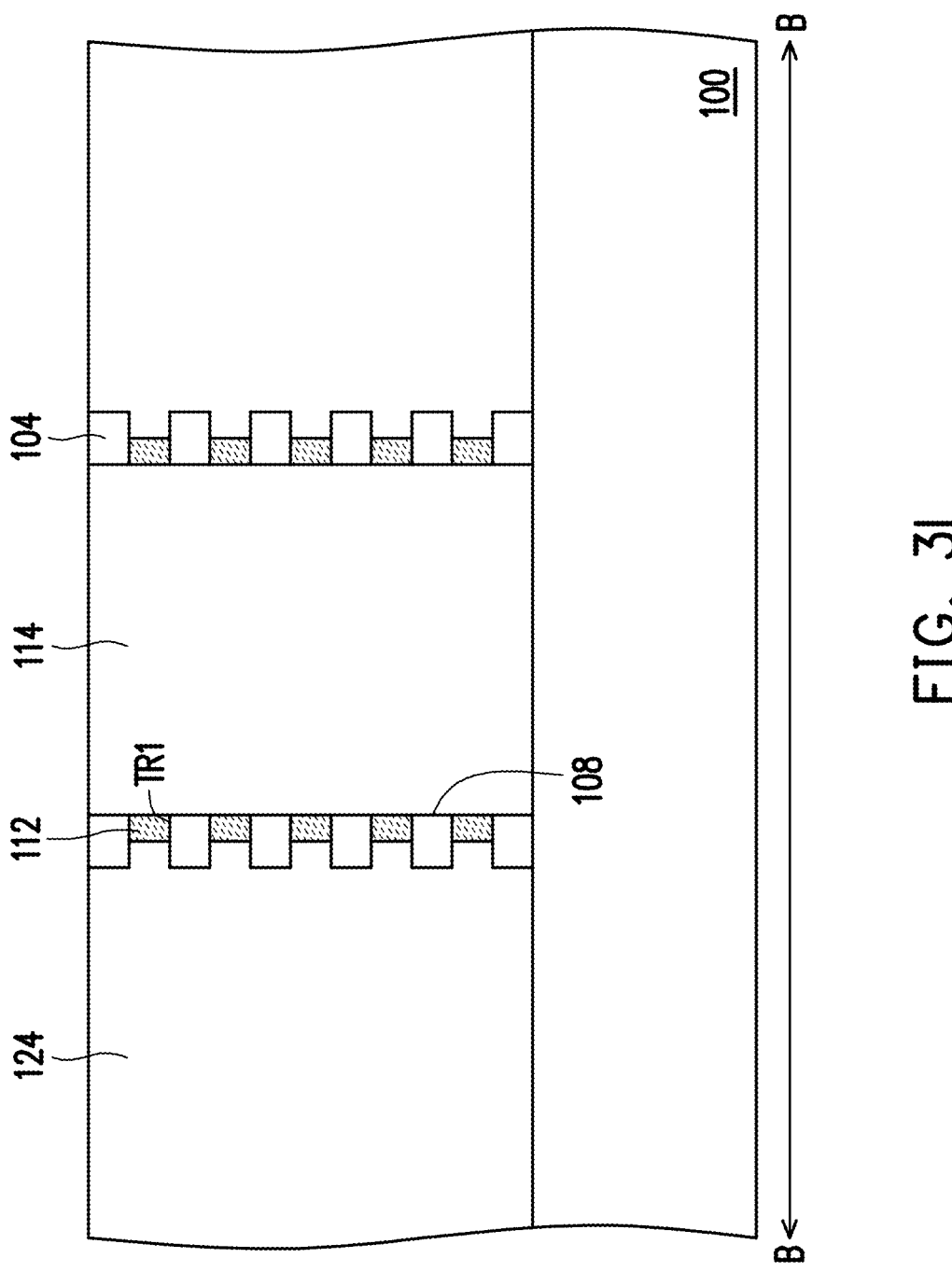

Referring to FIGS. 1I, 2I and 3I, the sacrificial layers 106 in the initial stacked structure 102 are removed through the slits SLT2 to form a trench TR2 between adjacent insulating material layers 104. The method for removing the sacrificial layers 106 is well known to those skilled in the art and will not be described further here. As a result, the channel layer 112 and the first doped region R1 and the second doped region R2 located in the channel layer 112 are exposed between the adjacent insulating material layers 104.

Figure 1J:
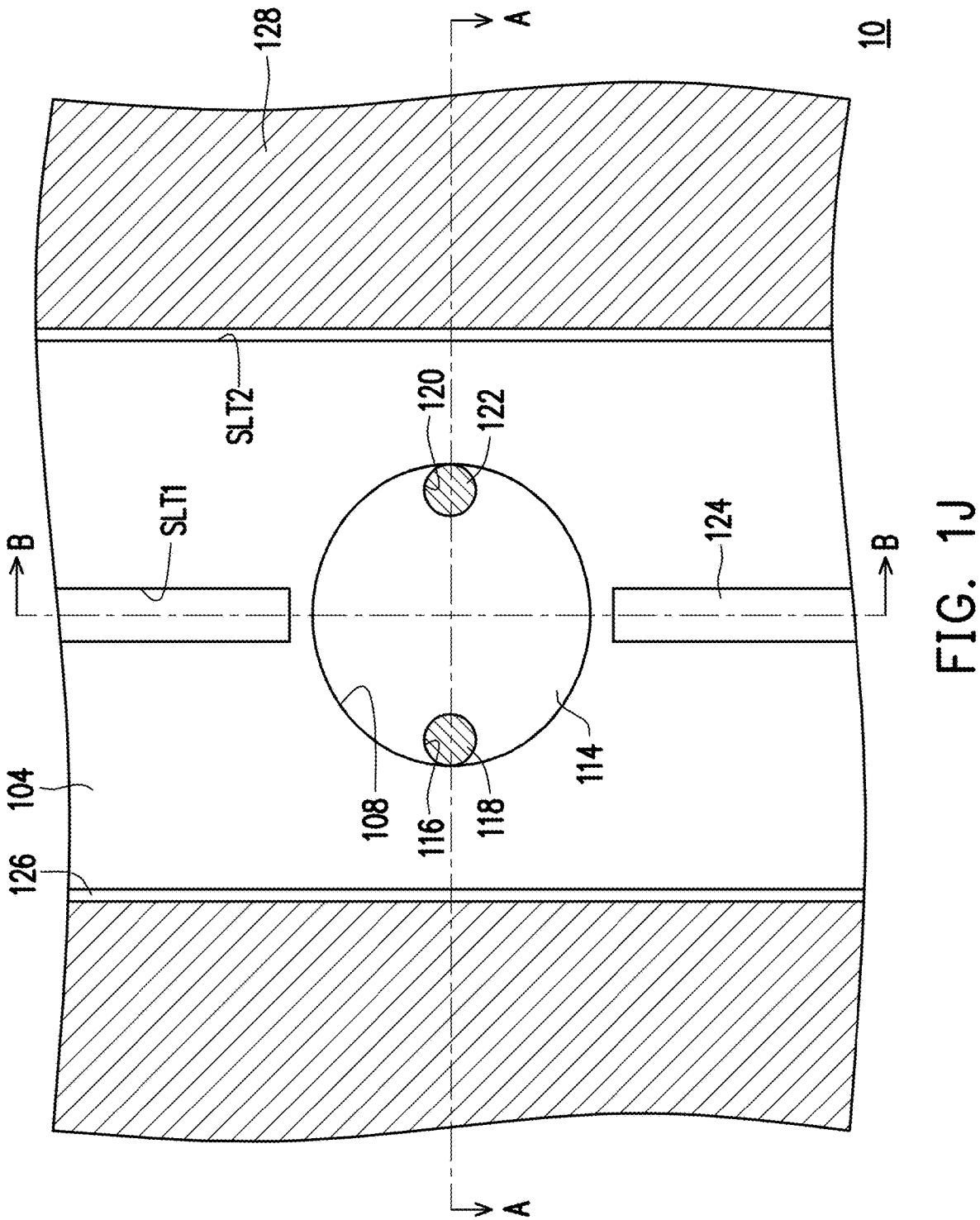
Figure 2J:
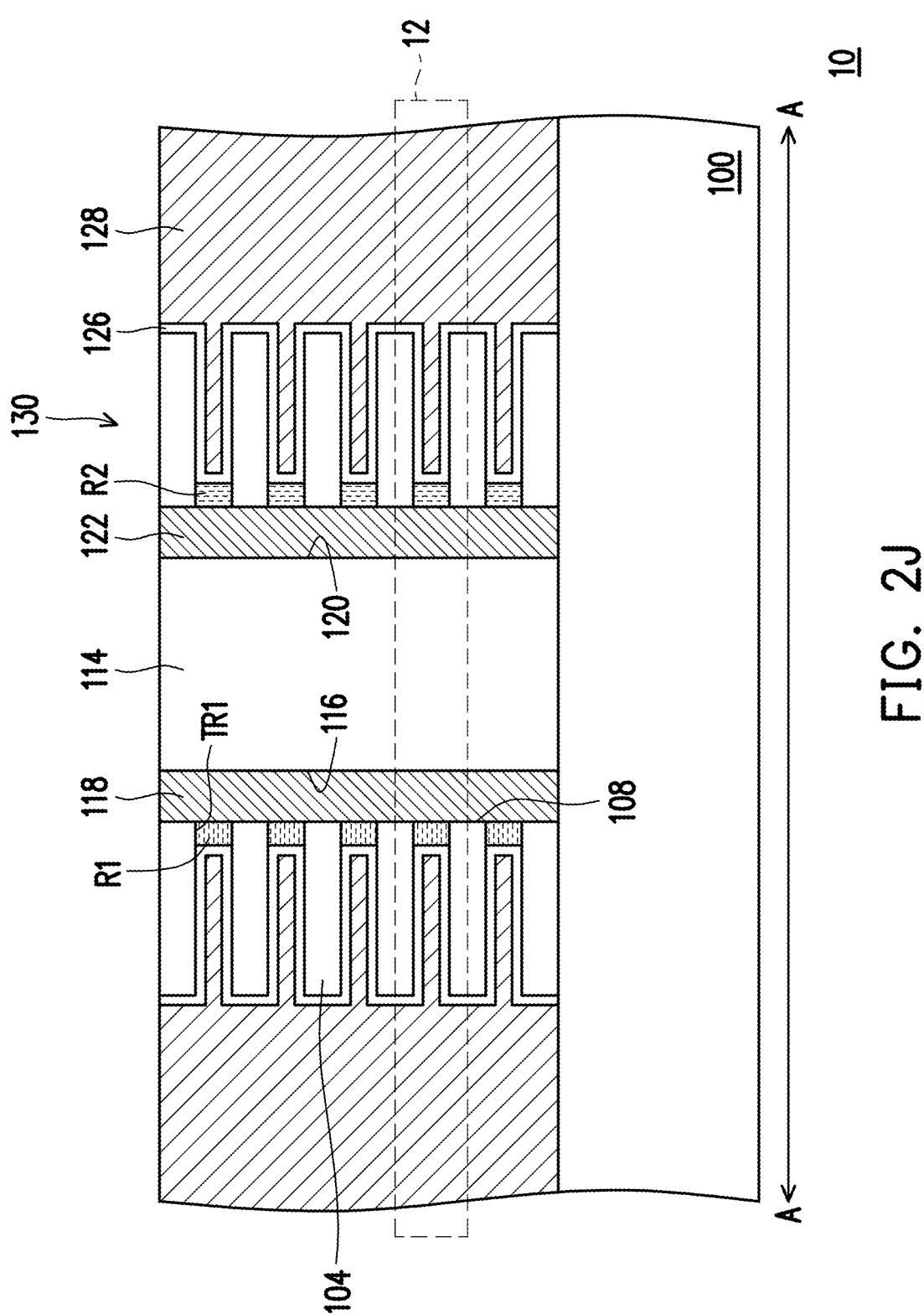
Figure 3J:
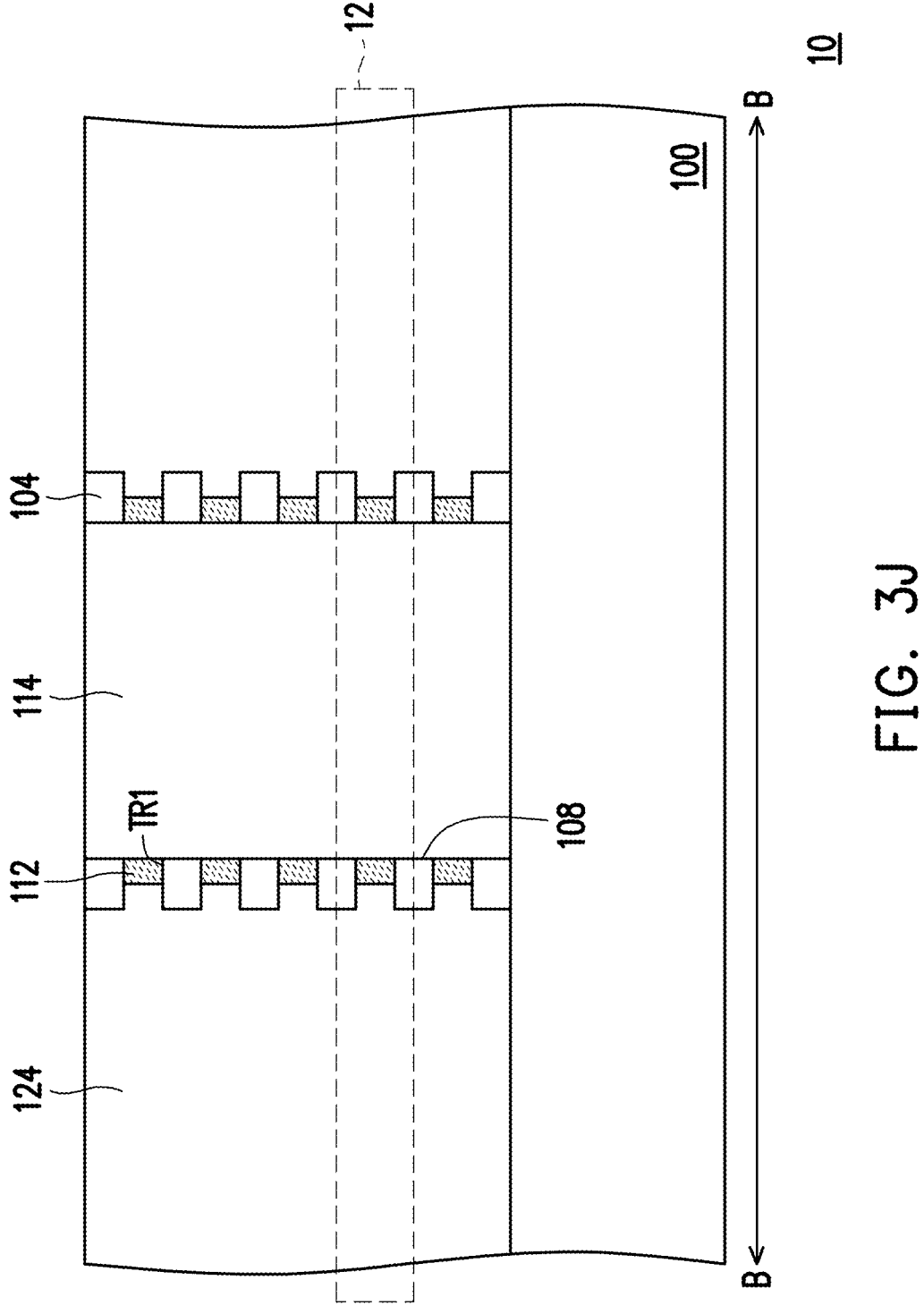
Figure 5:
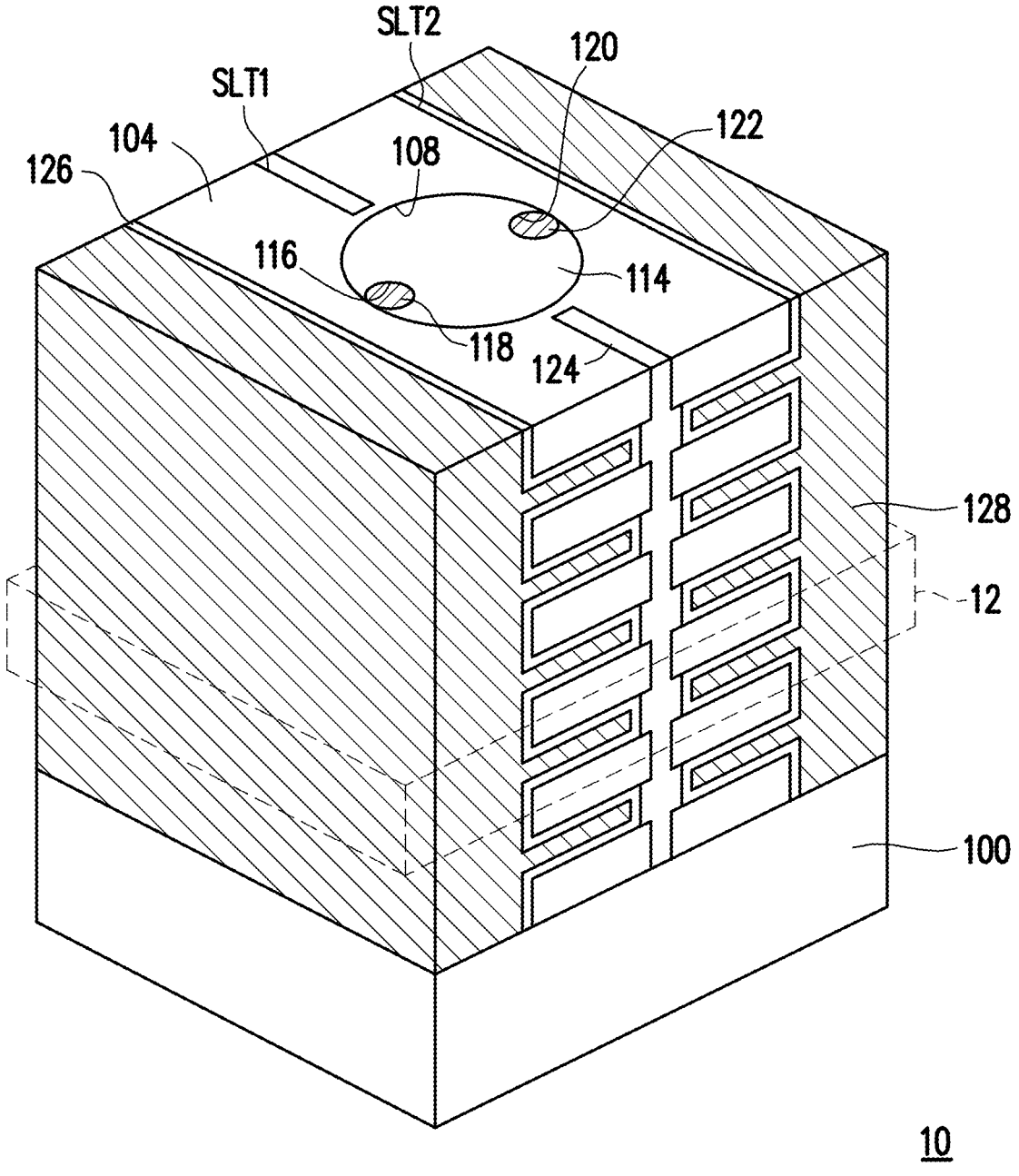
FIG. 5 is a 3D schematic diagram of the 3D memory of the embodiment of the present invention.
Figure 6:
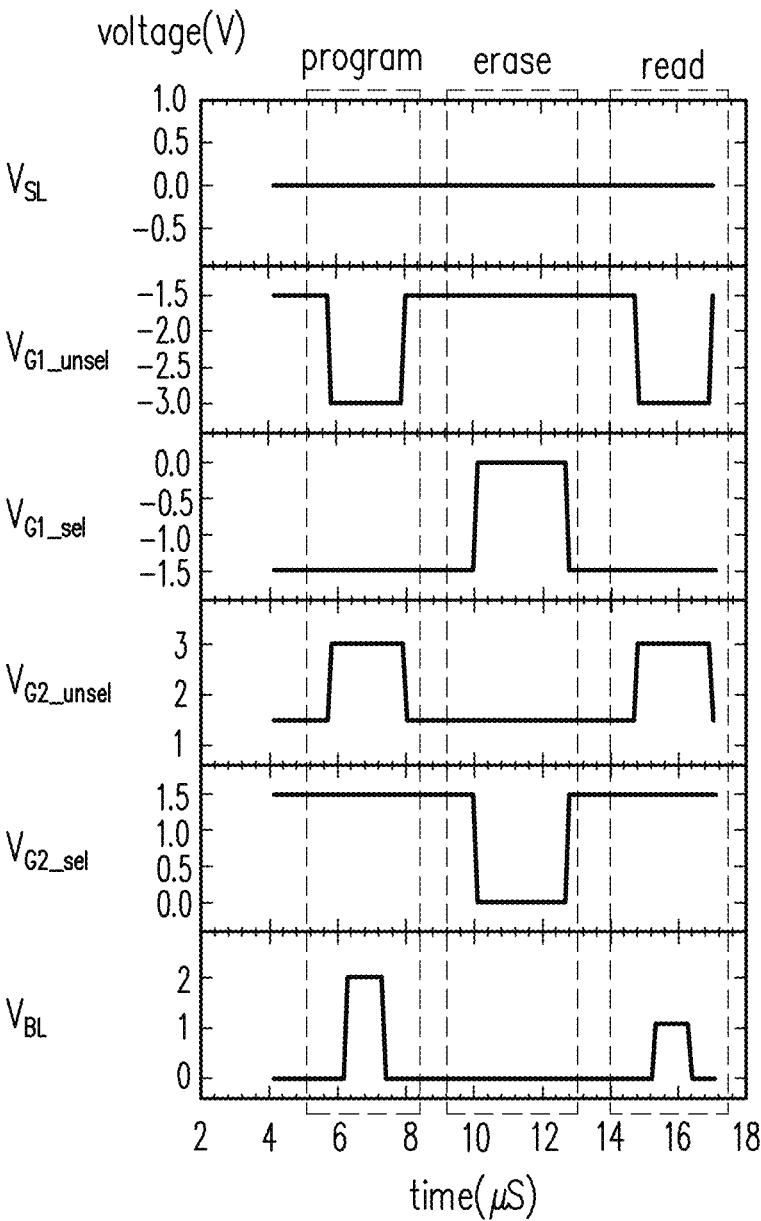
FIG. 6 is a schematic diagram of the operating method of the 3D memory of the embodiment of the present invention.

Referring to FIGS. 1J, 2J and 3J, an insulating layer 126 is conformally formed on the initial stacked structure 102. The insulating layer 126 is filled into trenches TR2 and formed on the sidewall and the bottom of each trench TR2. The insulating layer 126 is, for example, a silicon oxide layer. Then, an anisotropic etching process may be performed to remove the insulating layer 126 on the top surface of the initial stacked structure 102 and on the surface of the dielectric substrate 100. Afterwards, a gate layer 128 is formed on the dielectric substrate 100, and fills the trenches TR2. The gate layer 128 is, for example, a metal layer. The insulating material layer 104 and the gate layer 128 located between the adjacent insulating material layers 104 constitute a stacked structure 130. In this way, a 3D memory 10 of the present embodiment is formed. The 3D schematic diagram of the 3D memory 10 is shown in FIG. 5.

In the present embodiment, the insulating layers 126 are formed on both sides of the slits SL1 at the same time, so the insulating layers 126 on both sides of the slits SL1 may have the same thickness, but the present invention is not limited thereto. In other embodiments, depending on actual needs, the insulating layers 126 with different thicknesses may be formed on both sides of the slits SL1.

In addition, in the present embodiment, the gate layers 128 are formed on both sides of the slits SL1 at the same time, so the gate layers 128 on both sides of the slits SL1 have the same material, but the present invention is not limited thereto. In other embodiments, depending on actual needs, the gate layers 128 of different materials may be formed on both sides of the slits SL1.

In the 3D memory 10, the stacked structure 130 composed of the insulating layers formed by the insulating material layers 104 and the gate layers 128 is disposed on the dielectric substrate 100, the insulating layer 114 as an insulating pillar is disposed on the dielectric substrate 100 and penetrates through the stacked structure 130, the conductive layer 118 as the bit line pillar and the conductive layer 122 as the source line pillar are disposed on the dielectric substrate 100, located in the insulating layer 114 and penetrate through the stacked structure 130, and each annular channel layer 112 is disposed between adjacent insulating material layers 104 corresponding to the gate layer 128.

The insulating layer 124 as the separation layer extends outward from the opposite ends of the insulating layer 114 as the insulating pillar, and penetrates through the stacked structure 130 in the stacked direction of the stacked structure 130, so that each gate layer 128 is divided into two portions as a first gate and a second gate in a direction intersecting the extending direction of the insulating layer 124. That is, each gate layer 128 includes the first gate and the second gate separated from each other. The insulating layer 126 is disposed between the gate layer 128 and the channel layer 112, so the insulating layer 126 between the first gate and the channel layer 112 is used as a first gate insulating layer, and the insulating layer 126 between the second gate and the channel layer 112 is used as a second gate insulating layer.

The first doped region R1 of the first conductive type and the second doped region R2 of the second conductive type are disposed in each channel layer 112, and respectively adjacent the first gate and the second gate, so that the conductive layer 118 as the bit line pillar is located inside the annular channel layer 112 and is in contact with the first doped region R1, and the conductive layer 122 as the source line pillar is located inside the annular channel layer 112 and is in contact with the second doped region R2.

In addition, based on the steps described in FIGS. 1G, 2G and 3G, an etching process is performed through the slits SLT1 to remove a part of each sacrificial layer 106 until the channel layer 112 is exposed. Therefore, in the 3D memory 10, the width of the portion of the slit SLT1 corresponding to the gate layer 128 may be greater than the width of the portion of the slit SLT1 corresponding to the insulating material layer 104, which may be clearly seen from FIG. 5.

In addition, according to the steps described in FIGS. 1G, 2G and 3G, the portion of the slit SLT1 corresponding to the gate layer 128 exposes the channel layer 112 between the first doped region R1 and the second doped region R2. In the present embodiment, the portion of the slit SLT1 corresponding to the gate layer 128 exposes the center portion of the channel layer 112 between the first doped region R1 and the second doped region R2. In other embodiments, the portion of the slit SLT1 corresponding to gate layer 128 exposes the portion adjacent to the first doped region R1 or the second doped region R2 of the channel layer 112.

Figure 4:
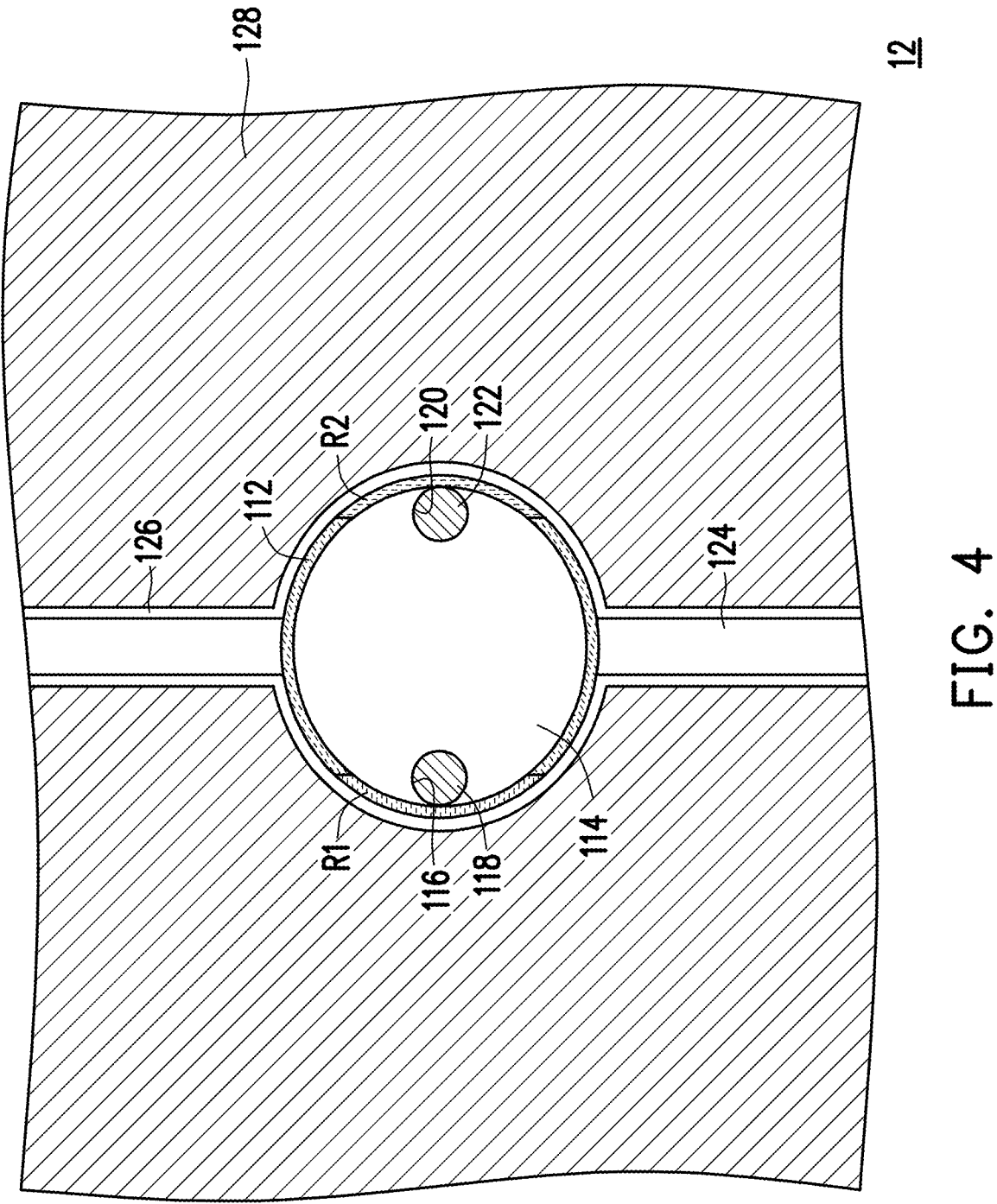
FIG. 4 is a schematic top view of a memory cell of the 3D memory of the embodiment of the present invention.

In the present embodiment, the 3D memory 10 has a plurality of memory cells 12. As shown in FIG. 4, each memory cell 12 is composed of a gate layer 128, a channel layer 112 corresponding to the gate layer 128, a first doped region R1 as the drain region and a second doped region R2 as the source region located in the channel layer 112, a conductive layer 118 as the bit line pillar, a conductive layer 122 as the source line pillar and an insulating layer 126 as the gate insulating layer. As shown in FIGS. 1J, 2J, and 3J, the 3D memory 10 has five memory cells 12 stacked with each other. Depending on the actual needs, a plurality of 3D memory 10 may be disposed on the dielectric substrate 100 in an array manner. This is well known to those skilled in the art and will not be described further here.

The following will take the 3D memory 10 as an example to explain the operating methods of the 3D memory of the present invention, as shown in FIF. 8.

First, a program operation is performed on a selected memory cell 12 in the 3D memory 10. For example, in the program operation, a first gate voltage $V_{G1\_sel}$ (first negative gate voltage, for example, −1.5 V) is applied to the first gate (the gate layer 128 adjacent to the first doped region R1) of the selected memory cell, a first gate voltage $V_{G2\_sel}$ (first positive gate voltage, for example, 1.5 V) is applied to the second gate (the gate layer 128 adjacent to the second doped region R2) of the selected memory cell, a first gate voltage $V_{G1\_unsel}$ (second negative gate voltage, for example, −3.0 V) greater than the first gate voltage $V_{G1\_sel}$ is applied to the first gate of the unselected memory cells, a second gate voltage $V_{G2\_unsel}$ (second positive gate voltage, for example, +3.0 V) greater than the second gate voltage $V_{G2\_sel}$ is applied to the second gate of the unselected memory cells, a bit line voltage $V_{BL}$ (first bit line positive voltage, for example, +3.0 V) is applied to the bit line pillar (the conductive layer 118), and no source line voltage $V_{SL}$ is applied to the source line pillar (the conductive layer 122).

At this time, the selected memory cell may be programmed to state "1", while the unselected memory cells remain in the initial state. In addition, in the program operation, applying a greater negative voltage to the first gate of the unselected memory cell s and applying a greater positive voltage to the second gate of the unselected memory cells may effectively avoid write interference.

In addition, after performing the program operation on the selected memory cell, the erase operation may be performed on the selected memory cell. For example, in the erase operation, the first gate voltage $V_{G1\_sel}$ is not applied to the first gate of the selected memory cell, the second gate voltage $V_{G2\_sel}$ is not applied to the second gate of the selected memory cell, the first gate voltage $V_{G1\_unsel}$ (third negative gate voltage, for example, −1.5 V) less than the second negative gate voltage is applied to the first gate of the unselected memory cells, the second gate voltage $V_{G2\_unsel}$ (third positive gate voltage, for example, +1.5 V) less than the second positive gate voltage is applied to the second gate of the unselected memory cells, no bit line voltage $V_{BL}$ is applied to the bit line pillar, and no source line voltage $V_{SL}$ is applied to the source line pillar.

At this time, the selected memory cell may be erased to state "0", while the unselected memory cells remain in the initial state.

In addition, after performing the erase operation on the selected memory cell, a read operation may be performed on the selected memory cell. For example, in the read operation, the first gate voltage $V_{G1\_sel}$ (fourth negative gate voltage, for example, −1.5 V) is applied to the first gate of the selected memory cell, the second gate voltage $V_{G2\_sel}$ (fourth positive gate voltage, for example, +1.5 V) is applied to the second gate of the selected memory cell, the first gate voltage $V_{G1\_unsel}$ (fifth negative gate voltage, for example, −3.0 V) greater than the third negative gate voltage is applied to the first gate of the unselected memory cells, the second gate voltage $V_{G2\_unsel}$ (fifth positive gate voltage, for example, +3.0 V) greater than the third positive gate voltage is applied to the second gate of the unselected memory cells, the bit line voltage $V_{BL}$ (second bit line positive voltage, for example, 0.105 V) is applied to the bit line pillar, and no source line voltage $V_{SL}$ is applied to the source line pillar.

At this time, the selected memory cell may be read out of status "0". In addition, in the read operation, applying a greater negative voltage to the first gate of the unselected memory cells and applying a greater positive voltage to the second gate of the unselected memory cell s may effectively avoid sneak voltage.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A three-dimensional (3D) memory, comprising:
   a stacked structure, disposed on a dielectric substrate, and comprising a plurality of gate layers and a plurality of insulating layers alternately stacked, wherein each gate layer comprising a first gate and a second gate separated from each other;
   a plurality of annular channel layers, each corresponding to one of the plurality of gate layers and disposed between adjacent insulating layers;

a p-type doped region, disposed in each annular channel layer and adjacent to the first gate;

an n-type doped region, disposed in each annular channel layer and adjacent to the second gate;

a source line pillar, disposed on the dielectric substrate, penetrating through the stacked structure, and located inside the annular channel layer to be in contact with the n-type doped region;

a bit line pillar, disposed on the dielectric substrate, penetrating through the stacked structure, and located inside the annular channel layer to be in contact with the p-type doped region;

a first gate insulating layer, disposed between the first gate and the annular channel layer; and a second gate insulating layer, disposed between the second gate and the annular channel layer.

2. The 3D memory of claim 1, wherein each of a material of the first gate and a material of the second gate comprises metal.

3. The 3D memory of claim 2, wherein the material of the first gate is the same as the material of the second gate.

4. The 3D memory of claim 2, wherein the material of the first gate is different from the material of the second gate.

5. The 3D memory of claim 1, wherein a thickness of the first gate insulating layer is the same as a thickness of the second gate insulating layer.

6. The 3D memory of claim 1, wherein a thickness of the first gate insulating layer is different from a thickness of the second gate insulating layer.

7. The 3D memory of claim 1, wherein each of a material of the source line pillar and a material of the bit line pillar comprises metal or doped polysilicon.

8. The 3D memory of claim 1, wherein a material of the annular channel layer comprises undoped polysilicon.

9. The 3D memory of claim 1, further comprising an insulating pillar disposed on the dielectric substrate, penetrating the stacked structure, and located inside the annular channel layer, wherein the source line pillar and the bit line pillar are located in the insulating pillar.

10. The 3D memory of claim 1, wherein the stacked structure has a slit, and the slit penetrates through the stacked structure to separate the first gate from the second gate.

11. The 3D memory of claim 10, wherein a width of a portion of the slit corresponding to the gate layer is greater than a width of a portion of the slit corresponding to the insulating layer.

12. The 3D memory of claim 10, wherein a portion of the slit corresponding to the gate layer exposes the annular channel layer between the p-type doped region and the n-type doped region.

13. The 3D memory of claim 12, wherein the slit exposes a center portion of the annular channel layer.

14. The 3D memory of claim 12, wherein the slit exposes a portion of the annular channel layer adjacent the p-type doped region.

15. The 3D memory of claim 12, wherein the slit exposes a portion of the annular channel layer adjacent the n-type doped region.

16. The 3D memory of claim 10, further comprising a separation layer filling the slit.

17. An operating method of a 3D memory, suitable for operating the 3D memory of claim 1, wherein each gate layer and the annular channel layer, the p-type doped region, the n-type doped region, the first gate insulating layer and the second gate insulating layer corresponding to the gate layer form a memory cell, and comprising:

selecting a memory cell; and performing a program operation on the selected memory cell, wherein the program operation comprises:

applying a first negative gate voltage to the first gate of the selected memory cell;

applying a first positive gate voltage to the second gate of the selected memory cell;

applying a second negative gate voltage to the first gate of the unselected memory cells;

applying a second positive gate voltage to the second gate of the unselected memory cells;

applying a first bit line positive voltage to the bit line pillar; and applying no voltage to the source line pillar, wherein the first negative gate voltage is less than the second negative gate voltage, and the first positive gate voltage is less than the second positive gate voltage.

18. The operating method of claim 17, wherein an erase operation is performed on the selected memory cell after the program operation, and the erase operation comprises:

applying no voltage to the first gate of the selected memory cell;

applying no voltage to the second gate of the selected memory cell;

applying a third negative gate voltage to the first gate of the unselected memory cells;

applying a third positive gate voltage to the second gate of the unselected memory cells;

applying no voltage to the bit line pillar;

applying no voltage to the source line pillar, wherein the third negative gate voltage is less than the second negative gate voltage, and the third positive gate voltage is less than the second positive gate voltage.

19. The operating method of claim 18, wherein, a read operation is performed on the selected memory cell after the erase operation, and the read operation comprises:

applying a fourth negative gate voltage to the first gate of the selected memory cell;

applying a fourth positive gate voltage to the second gate of the selected memory cell;

applying a fifth negative gate voltage to the first gate of the unselected memory cells;

applying a fifth positive gate voltage to the second gate of the unselected memory cells;

applying a second bit line positive voltage to the bit line pillar; and applying no voltage to the source line pillar, wherein the fifth negative gate voltage is greater than the third negative gate voltage, the fifth positive gate voltage is greater than the third positive gate voltage, and the second bit line positive voltage is greater than the first bit line positive voltage.

20. The operating method of claim 19, wherein the fourth negative gate voltage is equal to the first negative gate voltage, the fourth positive gate voltage is equal to the first positive gate voltage, the fifth negative gate voltage is equal to the second negative gate voltage, and the fifth positive gate voltage equal to the second positive gate voltage.

* * * * *